United States Patent
Yamagami

(10) Patent No.: US 10,832,990 B2
(45) Date of Patent: Nov. 10, 2020

(54) SEMICONDUCTOR DEVICE WITH EXTERNAL TERMINAL

(71) Applicant: ROHM CO., LTD., Kyoto (JP)

(72) Inventor: Mamoru Yamagami, Kyoto (JP)

(73) Assignee: ROHM CO., LTD., Kyoto (JP)

(*) Notice: Subject to any disclaimer, the term of this patent is extended or adjusted under 35 U.S.C. 154(b) by 67 days.

(21) Appl. No.: 16/042,793

(22) Filed: Jul. 23, 2018

(65) Prior Publication Data

US 2019/0080988 A1    Mar. 14, 2019

(30) Foreign Application Priority Data

Sep. 11, 2017    (JP) .................................. 2017-174084

(51) Int. Cl.
*H01L 23/495* (2006.01)
*H01L 23/31* (2006.01)
(Continued)

(52) U.S. Cl.
CPC .......... *H01L 23/4951* (2013.01); *H01L 23/13* (2013.01); *H01L 23/3114* (2013.01); *H01L 23/3121* (2013.01); *H01L 23/498* (2013.01); *H01L 23/49541* (2013.01); *H01L 23/49548* (2013.01); *H01L 23/49582* (2013.01);
(Continued)

(58) Field of Classification Search
CPC ............... H01L 23/4951; H01L 23/498; H01L 23/49548; H01L 23/49586; H01L 23/13; H01L 23/3121; H01L 23/3114; H01L 23/49582; H01L 23/49541; H01L 2924/181; H01L 2224/16245; H01L 2224/16225; H01L 21/486; H01L 23/49827; H01L 23/49805; H01L 23/147
See application file for complete search history.

(56) References Cited

U.S. PATENT DOCUMENTS

2003/0127747 A1*  7/2003  Kajiwara ............... H01L 24/13
                                                        257/778
2006/0261364 A1* 11/2006  Suehiro .................... C03C 27/06
                                                        257/100
(Continued)

FOREIGN PATENT DOCUMENTS

JP    2015053469 A    3/2015

*Primary Examiner* — Steven H Loke
*Assistant Examiner* — Juanita B Rhodes
(74) *Attorney, Agent, or Firm* — Hamre, Schumann, Mueller & Larson, P.C.

(57) ABSTRACT

The present invention provides a semiconductor device capable of being miniaturized and preventing reduction of mountability to a wiring substrate. The semiconductor device includes a conductive support having a support surface and a mounting surface facing opposite sides in a thickness direction z, and an end surface intersecting with the mounting surface and facing outside; a semiconductor element having an element back surface facing the support surface and an electrode formed on the element back surface, in which the electrode is connected to the support surface; and an external terminal conducted to the mounting surface and exposed to the outside; wherein the external terminal includes a Ni layer having P and an Au layer, and respectively connected to and laminated with at least one portion of each of the mounting surface and the end surface.

33 Claims, 33 Drawing Sheets

(51) Int. Cl.
*H01L 23/498* (2006.01)
*H01L 23/13* (2006.01)

(52) U.S. Cl.
CPC .................. *H01L 23/49586* (2013.01); *H01L 2224/16225* (2013.01); *H01L 2224/16245* (2013.01); *H01L 2924/181* (2013.01)

(56) References Cited

U.S. PATENT DOCUMENTS

2007/0058059 A1* 3/2007 Suehiro .................. H01L 33/56
 348/294
2014/0252582 A1* 9/2014 Nakabayashi .... H01L 23/49562
 257/676

* cited by examiner

SEMICONDUCTOR DEVICE WITH EXTERNAL TERMINAL

TECHNICAL FIELD

The present disclosure is related to a semiconductor device in a so-called Fan-Out type (fan-out type) package.

BACKGROUND

With the miniaturization of electronic devices in recent years, the miniaturization of semiconductor devices applied to the electronic devices is also developed. In response to such trend, a semiconductor device known as a Fan-Out type package has been developed. The Fan-Out type is a package type having a conductive support, a semiconductor element connected to the conductive support, and an external terminal laminated on a specific portion of the conductive support. The Fan-Out type has the feature that when viewed in a thickness direction of the conductive support, a peripheral edge of the external terminal comprises a portion located more outside than a periphery edge of the semiconductor element. By such configuration, the miniaturization of the semiconductor device can be achieved such that the arrangement of the external terminal is flexibly corresponding to a wiring substrate of an electronic device, or having more external terminals than the electrodes of the semiconductor elements. Therefore, compared to the case where a semiconductor element is directly mounted on a wiring substrate (a so-called Fan-In type (fan-in type)), the Fan-Out type can improve the mounting of the wiring substrate.

In patent literature 1, an example of a semiconductor device in a Fan-Out type package is disclosed. The semiconductor device comprises a rewiring (corresponding to the conductive support) formed with wiring patterns, a semiconductor chip (element) connected to the rewiring, and a bump (corresponding to the external terminal) disposed on a specific portion of the rewiring (referring to FIG. 3G of patent literature 1). The bump comprises a solder ball, a solder plating layer and the like.

With regard to the semiconductor device disclosed in patent literature 1, in the case where the bump is made of solder, when the wiring substrate of the electronic device is mounted on the semiconductor device, solder different from the bumps such as solder paste becomes unnecessary. Hence, the mounting accuracy of the semiconductor device to the wiring substrate can be further improved. However, in the case where the bumps melt in the reflow, and the wettability of the solder to the rewiring is poor, the attachment area of the solder on the rewiring becomes less, resulting in a concern that the mountability to the wiring substrate is reduced. Further, in this case, it is a concern that the semiconductor device is shifted with respect to the wiring substrate due to surface tension of the melted solder, and thus the mounting accuracy of the semiconductor device to the wiring substrate is reduced.

BACKGROUND TECHNICAL LITERATURES

Patent Literatures

[Patent Literature 1] Japanese Patent Application Laid-Open Publication No. 2015-53469.

BRIEF SUMMARY OF THE INVENTION

Problems to be Solved

In view of the above circumstances, it is an object of the present invention to provide a semiconductor device capable of being miniaturized and preventing reduction of mountability to a wiring substrate.

Technical Solution for Solving Problems

According to the present invention, a semiconductor device is provided, and comprises a conductive support having a support surface and a mounting surface facing opposite sides in a thickness direction, and an end surface intersecting with the mounting surface and facing outside; a semiconductor element having an element back surface facing the support surface and an electrode formed on the element back surface, in which the electrode is connected to the support surface; and an external terminal conducted to the mounting surface and exposed to the outside; wherein the external terminal includes a Ni layer having P and an Au layer, and respectively connected to and laminated with at least one portion of each of the mounting surface and the end surface.

In an embodiment of the present invention, preferably, the external terminal is across and laminated on a boundary between the mounting surface and the end surface.

In an embodiment of the present invention, preferably, the external terminal includes the Ni layer connected to the mounting surface and the end surface, and the Au layer connected to the Ni layer.

In an embodiment of the present invention, preferably, the external terminal comprises the Ni layer connected to the mounting surface and the end surface, a Pd layer connected to the Ni layer, and the Au layer connected to the Pd layer.

In an embodiment of the present invention, preferably, the conductive support includes a metal; the semiconductor device further includes a sealing resin, in which the sealing resin has a resin bask surface facing toward the same direction as the mounting surface and a resin lateral surface intersecting with the resin back surface, and covers at least a portion of the conductive support and the semiconductor element; and the external terminal is exposed from the resin back surface and the resin lateral surface to the outside.

In an embodiment of the present invention, preferably, the conductive support includes Ni.

In an embodiment of the present invention, preferably, the semiconductor device further includes an insulating film connected to a portion of the mounting surface and the resin back surface, wherein the external terminal is exposed from the insulating film to the outside.

In an embodiment of the present invention, preferably, the conductive support includes a lead frame having Cu.

In an embodiment of the present invention, preferably, the conductive support is formed with a concave portion recessed from the mounting surface toward the thickness direction; and the sealing resin is connected to the concave portion.

In an embodiment of the present invention, preferably, the semiconductor device further includes an insulating film configured to be connected to the resin back surface, wherein the external terminal exposed from the insulating film to the outside.

In an embodiment of the present invention, preferably, the end surface includes an external end surface intersecting with the support surface; and an inner end surface recessed from the external end surface toward an inner portion of the conductive support and intersecting with the external end surface and the mounting surface; and the external terminal is connected to and laminated with the inner end surface.

In an embodiment of the present invention, preferably, the sealing resin further includes a resin main surface facing toward an opposite side of the resin back surface; the resin lateral surface comprises: a resin outer surface intersecting with the resin main surface; and a resin inner surface recessed from the resin outer surface toward an inner portion of the sealing resin and intersecting with the resin outer surface and the resin back surface; the end surface is coplanar with the resin inner surface; and the external terminal is connected to and laminated with the whole of the end surface.

In an embodiment of the present invention, preferably, the conductive support includes a substrate comprising an intrinsic semiconductor material, and having a main surface facing toward the same direction as the support surface and a back surface facing toward the same direction as the mounting surface; and a conductive layer having the support surface, the mounting surface and the end surface, and disposed on the substrate; a recess is formed on the substrate, recessed from the main surface toward the thickness direction and accommodating the semiconductor element; and the conductive layer comprises: a first conductive layer having the support surface and disposed on a bottom surface of the recess; a second conductive layer having the mounting surface and the end surface and disposed on the back surface; and an intermediate conductive layer for conducting the first conductive layer and the second conductive layer with each other.

In an embodiment of the present invention, preferably, a through hole is formed on the substrate from the bottom surface of the recess to the back surface; and the intermediate conductive layer is disposed inside the through hole.

In an embodiment of the present invention, preferably, the substrate further includes an outer surface intersecting with the main surface; and an inner surface recessed from the outer surface toward an inner portion of the substrate and intersecting with the outer surface and the back surface; the end surface is coplanar with the inner surface; and the external terminal is connected to and laminated with the whole of the end surface.

In an embodiment of the present invention, preferably, the semiconductor device further includes a sealing resin filled in the recess and covering the semiconductor element.

In an embodiment of the present invention, preferably, the semiconductor device further includes a bonding layer interposed between the support surface and the electrode, wherein the bonding layer comprises an alloy having Sn.

Effects of the Present Invention

The semiconductor device comprises the external terminal. The external terminal is conducted to the mounting surface of the conductive support and exposed to the outside, and comprises a Ni layer (having P) and an Au layer formed by electroless plating. Therefore, the wettability of the solder to the external terminal becomes good. Further, the external terminal is connected to and laminated with at least one portion of each of the mounting surface and the end surface of the conductive support. By this configuration, the formation of welding fillets is facilitated at the external terminal laminated on the end surface of the conductive support. Therefore, the mounting strength of the semiconductor device to the wiring substrate is further improved.

Accordingly, the semiconductor device of the present invention is capable of being miniaturized and preventing reduction of mountability to a wiring substrate.

Other features and advantages of the present disclosure will be clearer from the following detailed description taken in conjunction with the accompanying drawings.

DETAILED DESCRIPTION

The implementation of the present invention (hereinafter referred to as "embodiments") will be described with reference to the accompanying drawings.

First Embodiment

Figure 9:
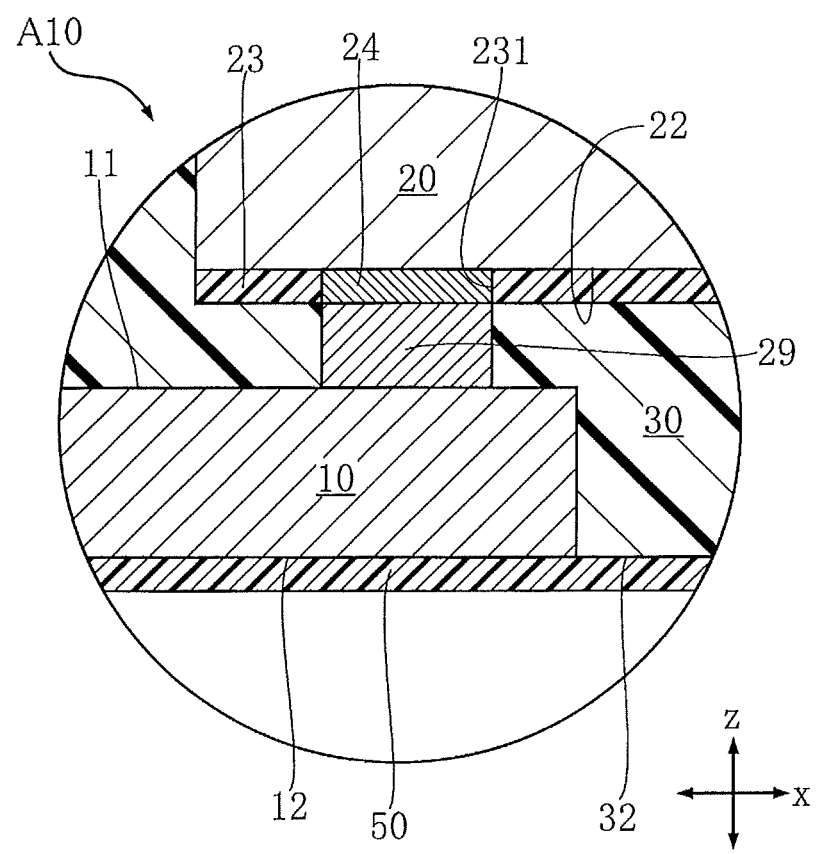
FIG. 9 is a partially enlarged view of FIG. 7 (near the bonding layer).
Figure 10:
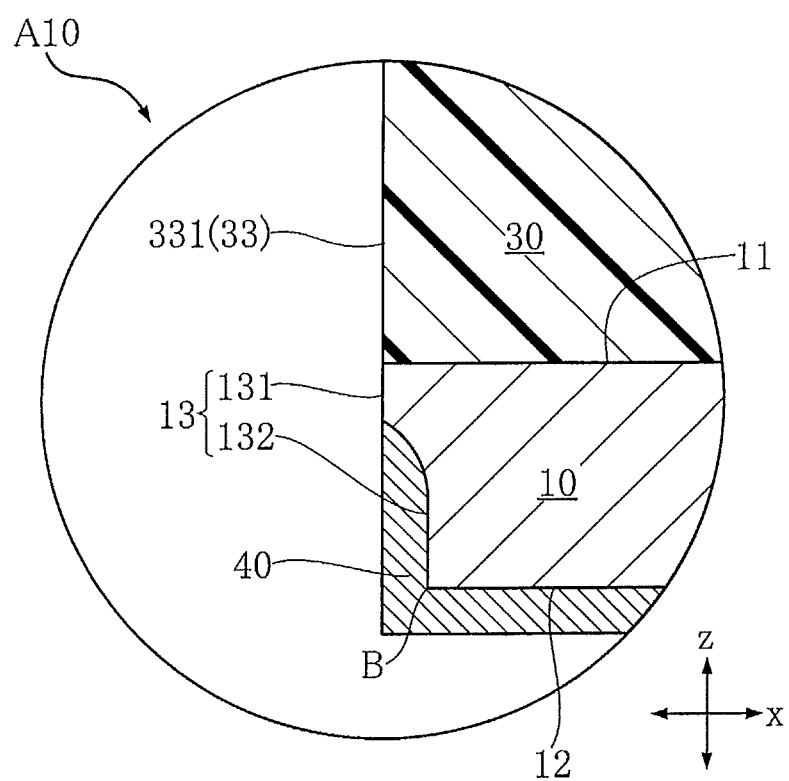
FIG. 10 is a partially enlarged view of FIG. 7 (near the end surface of the conductive support).
Figure 11:
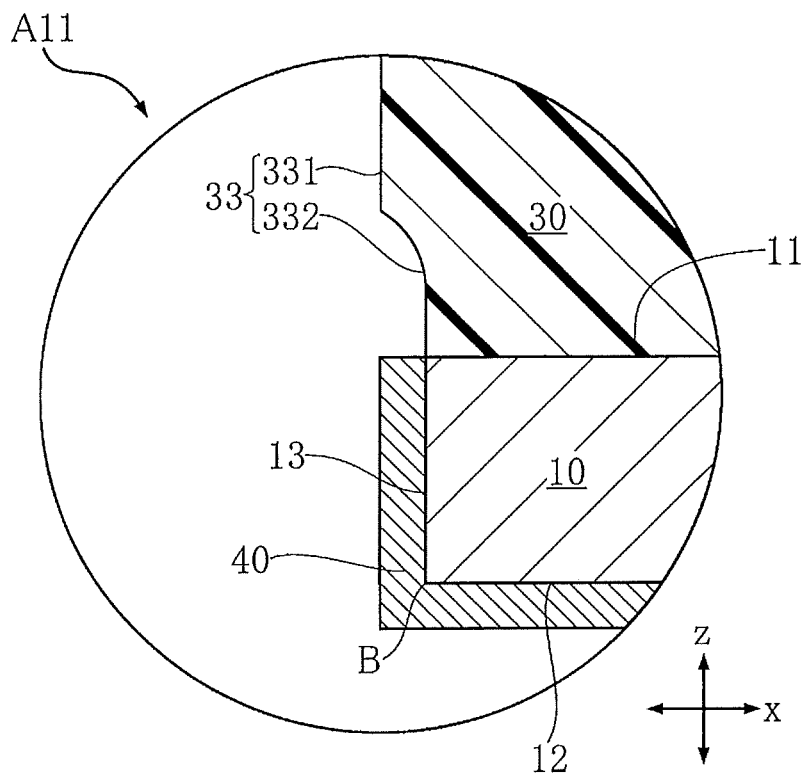
FIG. 11 is a partially enlarged view of the first variation of the semiconductor device shown in FIG. 1 (near the end surface of the conductive support).
Figure 12:
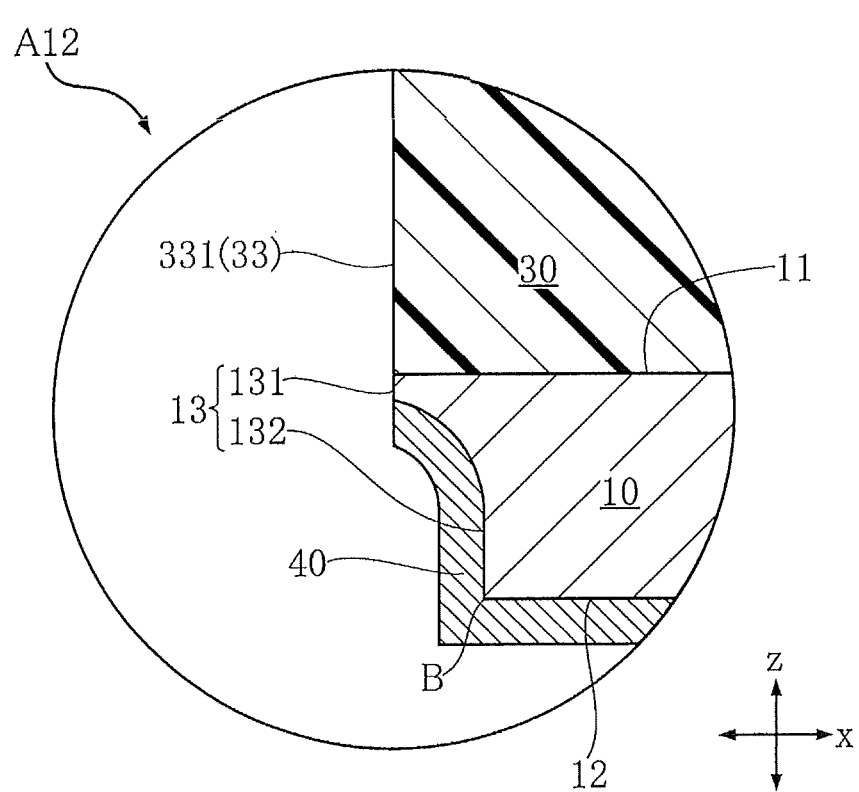
FIG. 12 is a partially enlarged view of the second variation of the semiconductor device shown in FIG. 1 (near the end surface of the conductive support).
Figure 13:
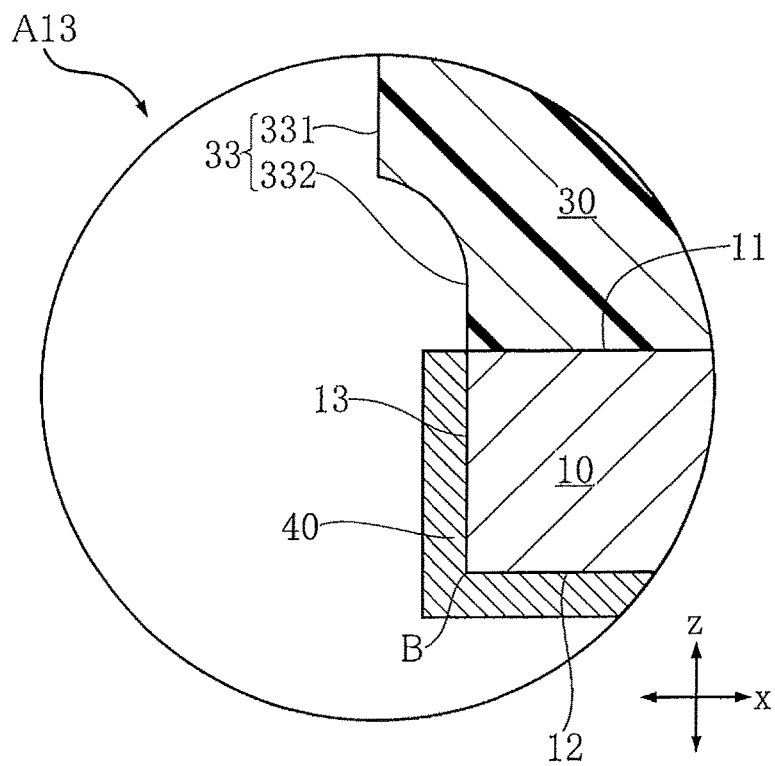
FIG. 13 is a partially enlarged view of the third variation of the semiconductor device shown in FIG. 1 (near the end surface of the conductive support).

Based on FIG. 1 to FIG. 13, a semiconductor device A10 of the first embodiment of the present invention is illustrated. The semiconductor device A10 comprises: a conductive support 10, a semiconductor element 20, a bonding layer 29, a sealing resin 30, an external terminal 40, and an insulating film 50. Herein, for ease of understanding, the sealing resin 30 and the insulating film 50 are seen through in FIG. 1. For ease of understanding, the sealing resin 30 is seen through in FIG. 2. FIG. 8 is a cross-sectional view taken along line VIII-VIII of FIG. 2 (the one-dot-chain-line in FIG. 2). The range shown in FIG. 11-FIG. 13 is the same as the region shown in FIG. 10. Further, the contour of the sealing resin 30 and the insulating film 50 are indicated by the dotted line (the two-dot-chain line) in FIG. 1.

Figure 1:
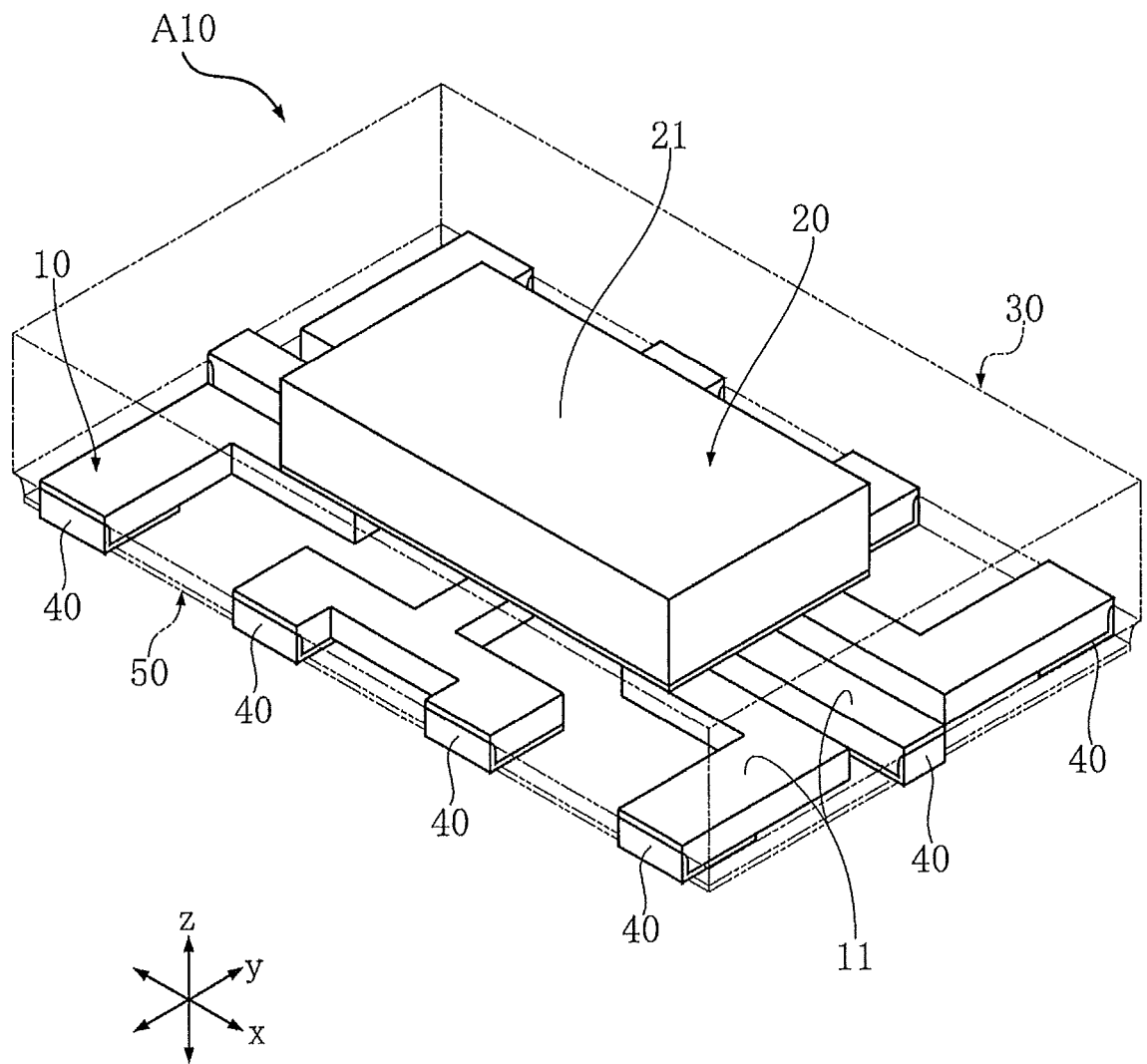
FIG. 1 is a perspective view showing a semiconductor device (through a sealing resin and an insulating film) according to the first embodiment of the present invention.
Figure 2:
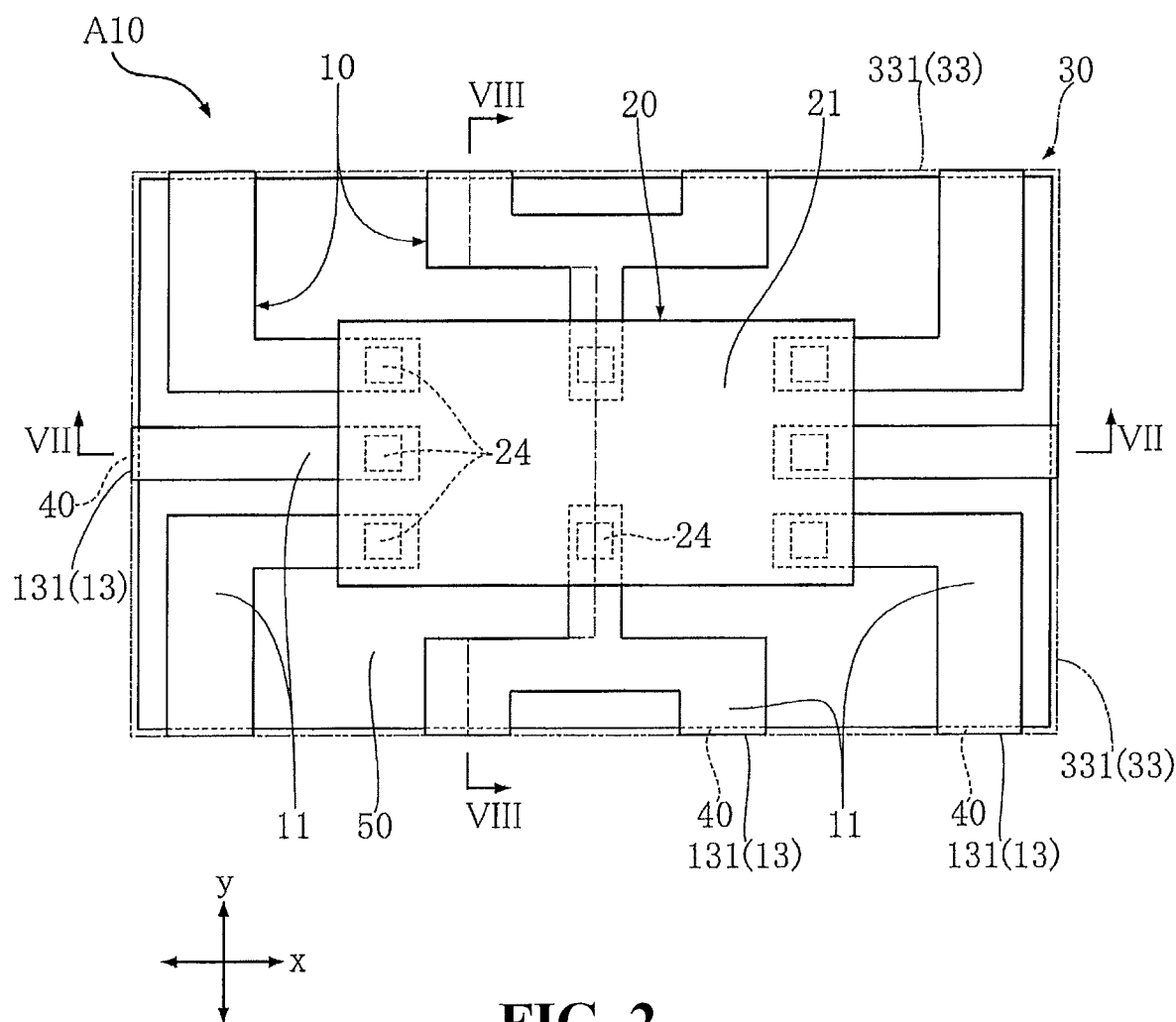
FIG. 2 is a top view of the semiconductor device (through the sealing resin) shown in FIG. 1.
Figure 3:
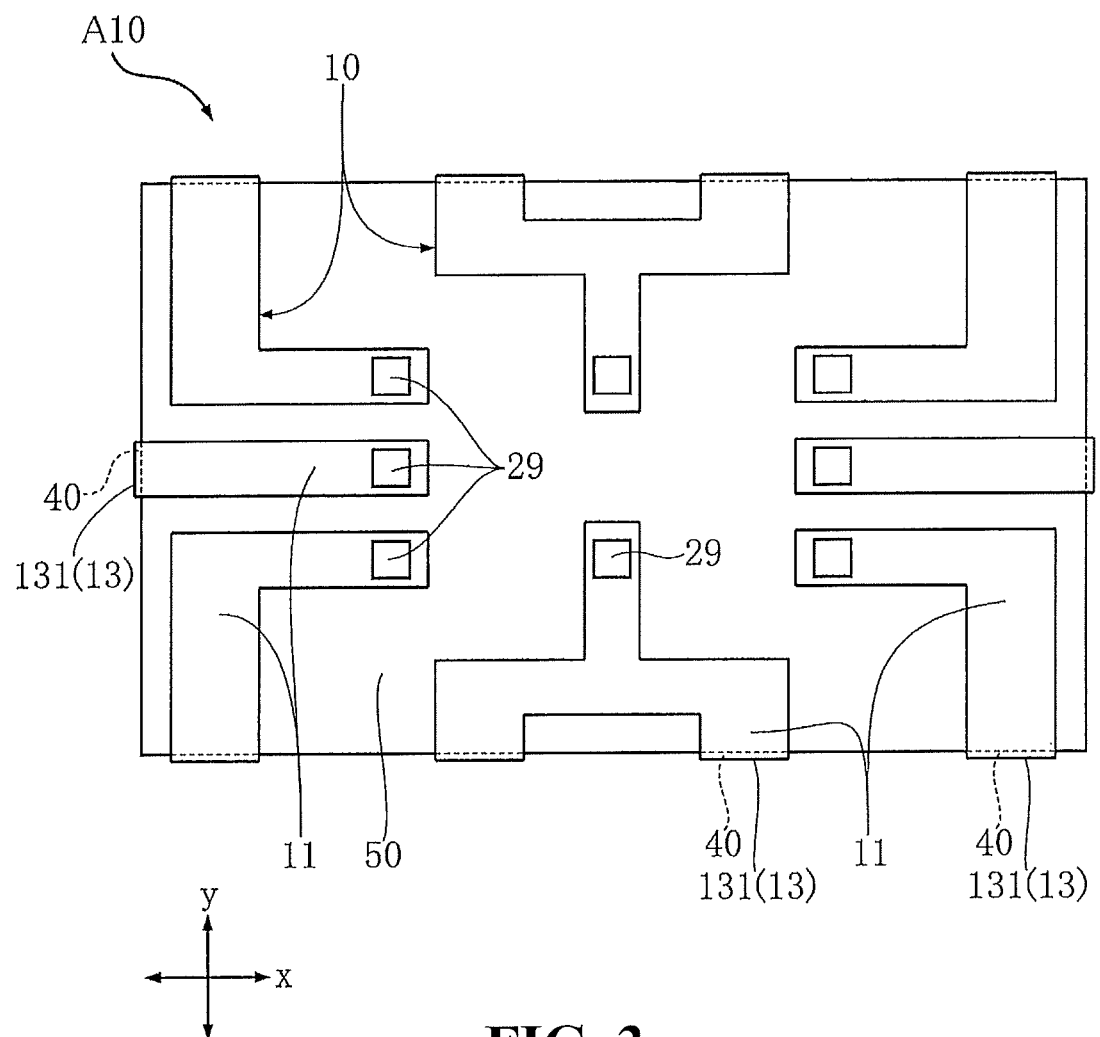
FIG. 3 is a top view of the semiconductor device (except the semiconductor element and the sealing resin) shown in FIG. 1.

The semiconductor device A10 shown in these figures is a resin package surface-mounted on a wiring substrate of various electronic devices. As shown in FIG. 2, when viewed in a thickness direction z of the conductive support 10 (hereinafter referred to as "top view"), a peripheral edge of the external terminal 40 comprises a portion located more outside than a periphery edge of the semiconductor element 20. Therefore, this package type is called a Fan-Out type. As shown in FIG. 1 and FIG. 2, the semiconductor device A10 is a rectangular shape in the top view. Herein, for ease of understanding, a longitudinal-side direction of the semiconductor device A10 orthogonal to the thickness direction z of the conductive support 10 is referred to as a first direction x. Further, a short-side direction of the semiconductor device A10 that is orthogonal to both the thickness direction z of the conductive support 10 and the first direction x is referred to as a second direction y. Further, in the following descriptions, the thickness direction z of the conductive support 10 is abbreviated as "thickness direction z".

Figure 4:
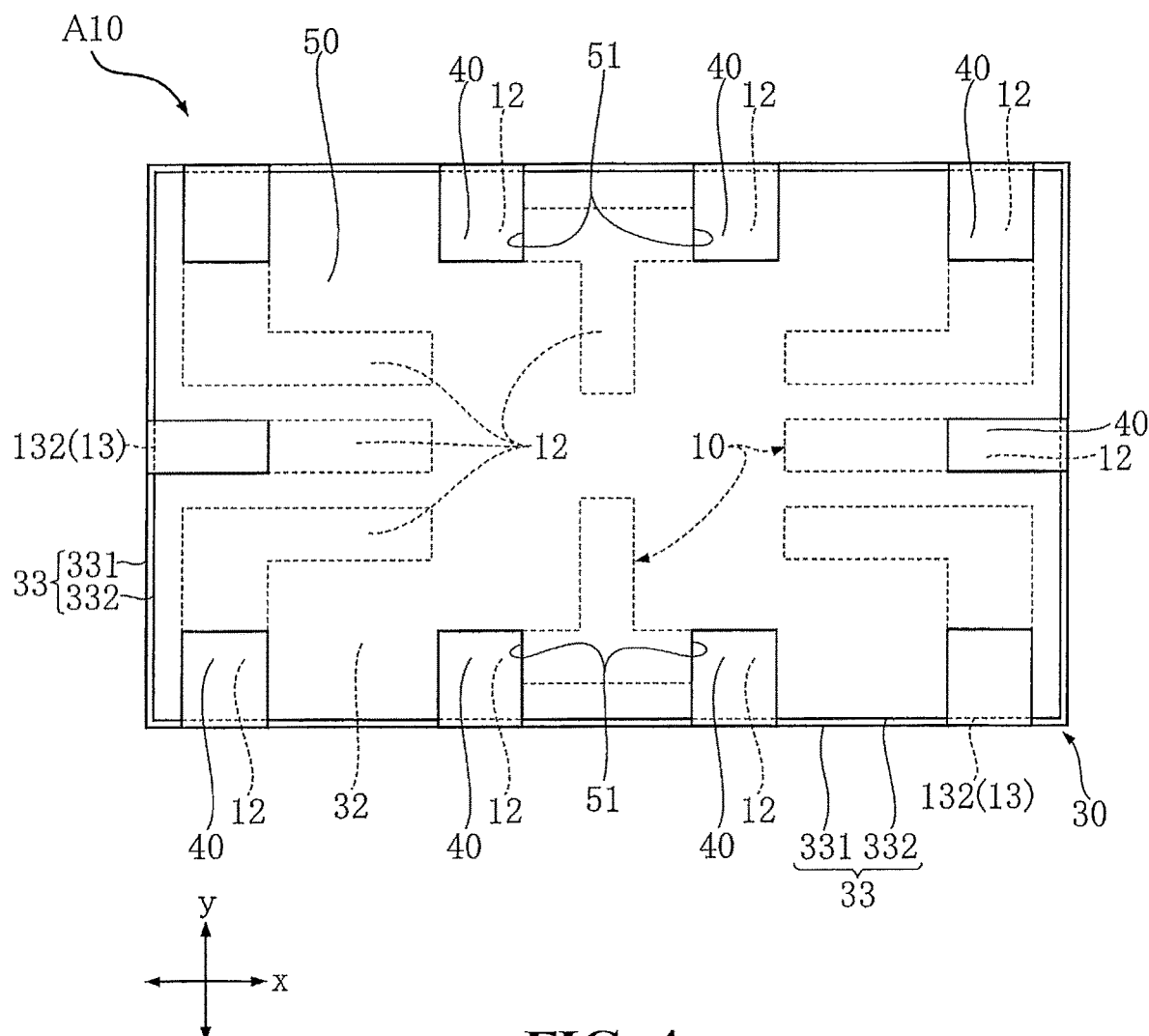
FIG. 4 is a bottom view of the semiconductor device shown in FIG. 1.

The conductive support 10 of the present embodiment is a conductive component made of a metal, and formed by electrolytic plating. The conductive support 10 comprises Ni. As shown in FIG. 1-FIG. 8, the conductive support comprises: a support surface 11, a mounting surface 12 and an end surface 13. The support surface 11 faces toward the thickness direction z. The support surface 11 is connected to the semiconductor element 20. The support surface 11 is covered by the sealing resin 30. The mounting surface 12 faces toward the thickness direction z, and the mounting surface 12 and the mounting surface 11 face opposite sides. As shown in FIG. 4, the mounting surface 12 has a plurality of areas (10 areas in the present embodiment) spaced apart from each other in the top view. In the present embodiment, each area of the mounting surface 12 is a rectangular shape. A portion of the mounting surface 12 is covered by the external terminal 40. The portion of the mounting surface 12 which is not covered by the external terminal 40 is covered by the insulating film 50. Hence, the mounting surface 12 cannot be viewed from outside the semiconductor device A10. The mounting surface 12 is coplanar with a resin back surface 32 of the sealing resin 30 (the details will be described later). Further, the thickness of the conductive support 10 (the length from the support surface 11 to the mounting surface 12 in the thickness direction z) is 10-200 µm.

As shown in FIG. 1-FIG. 8, the end surface 13 intersect with the mounting surface 12 and faces outside. In the present embodiment, the end surface 13 also interests with the support surface 11. The end surface 13 has a plurality of areas (10 areas in the present embodiment) facing toward any one of the first direction x and the second direction y. As shown in FIG. 10, each area of the end surface 13 has an outer end surface 131 and an inner end surface 132. The outer end surface 131 intersects with the support surface 11, and is coplanar with a resin outer surface 331 of the sealing resin 30 (the details will be described later). The outer end surface 131 is exposed to outside the semiconductor device A10. The inner end surface 132 is recessed from the outer end surface 131 toward an inner portion of the conductive support 10 (toward any one of the first direction x and the second direction y) and intersecting with both the outer end surface 131 and the mounting surface 12. The end portion of the inner end surface 132 intersecting with the outer end surface 131 is curved. The inner end surface 132 is covered by the external terminal 40. Hence, the inner end surface 132 cannot be viewed from outside the semiconductor device A10.

The semiconductor element 20 is the functional essential element of the semiconductor device A10. For example, the semiconductor element 20 is an integrated circuit (IC) such as an LSI (Large Scale Integration). Further, the semiconductor element 20 also can be a voltage control such as an LDO (Low Drop Out) or an amplification element such as an operational amplifier. As shown in FIG. 7 and FIG. 8, the semiconductor element 20 has an element main surface 21, an element back surface 22 and an element insulating film 23. The element main surface 21 faces toward the thickness direction z, and faces toward the same direction as the support surface 11 of the conductive support 10. The element back surface 22 faces toward the thickness direction z, and faces toward a side opposite to the element main surface 21. The element back surface 22 and the support surface 11 face to each other. The element insulating film 23 is configured to be in contact with the element back surface 22. The element insulating film 23 includes, for example, $Si_3N_4$ (nitride film) and polyimide which are laminated to each other. As shown in FIG. 2, FIG. 7 and FIG. 8, a plurality of electrodes 24 are formed on the element back surface 22. As shown in FIG. 9, each electrode 24 is exposed from an opening 231 formed in the element insulating film 23. Hence, the position of the opening 231 is corresponding to the position of the electrode 24. The electrode 24 includes, for example, A1. In the semiconductor element 20, the electrodes 24 are connected to the support surface 11 by flip chip bonding.

As shown in FIG. 3 and FIG. 7-FIG. 9, the bonding layer 29 is a conductive component interposed between the support surface 11 of the conductor support 10 and the electrode 24 of the semiconductor element 20. In the present embodiment, the electrode 24 is connected to the support surface 11 via the bonding layer 29. The bonding layer 29 includes an alloy having Sn. The bonding layer 29 can be formed to be connected to the support surface 11 by electrolytic plating, for example. The semiconductor element 20 is fixed and connected to the conductive support 10 by the bonding layer 29.

Figure 5:
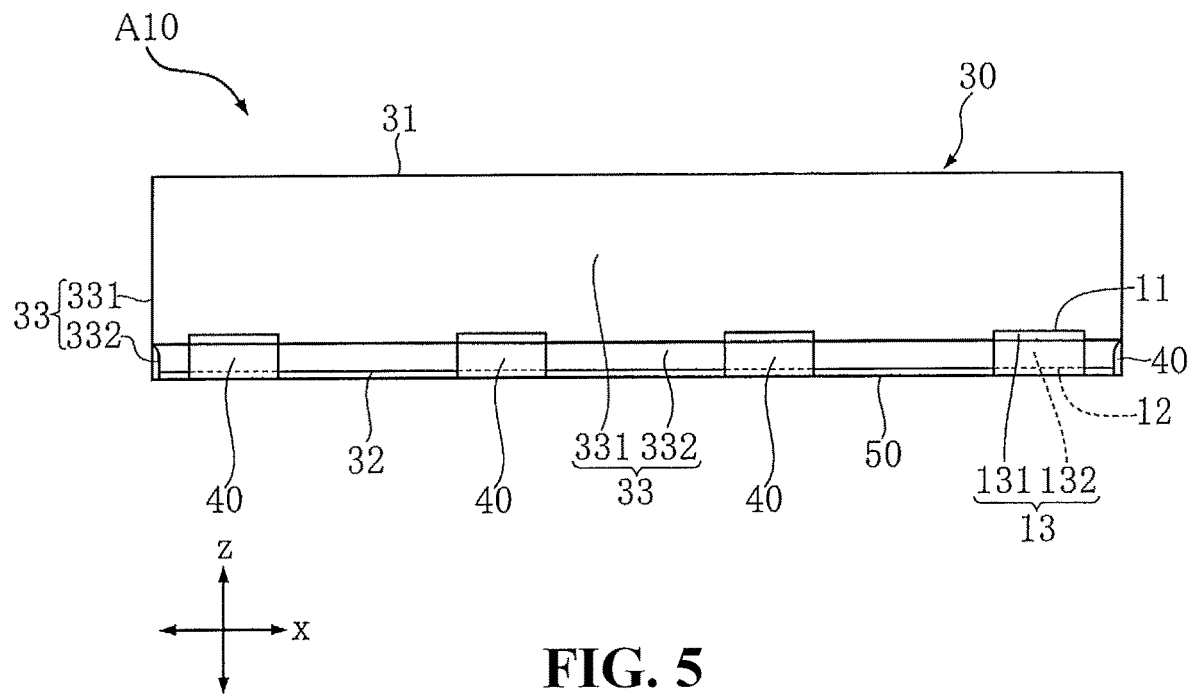
FIG. 5 is a front view of the semiconductor device shown in FIG. 1.
Figure 6:
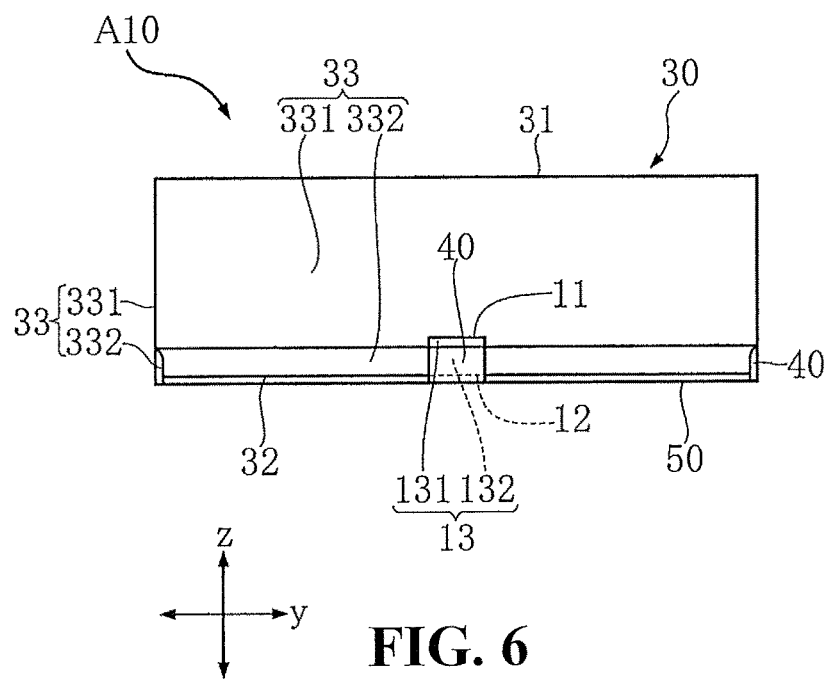
FIG. 6 is a right side view of the semiconductor device shown in FIG. 1.
Figure 7:
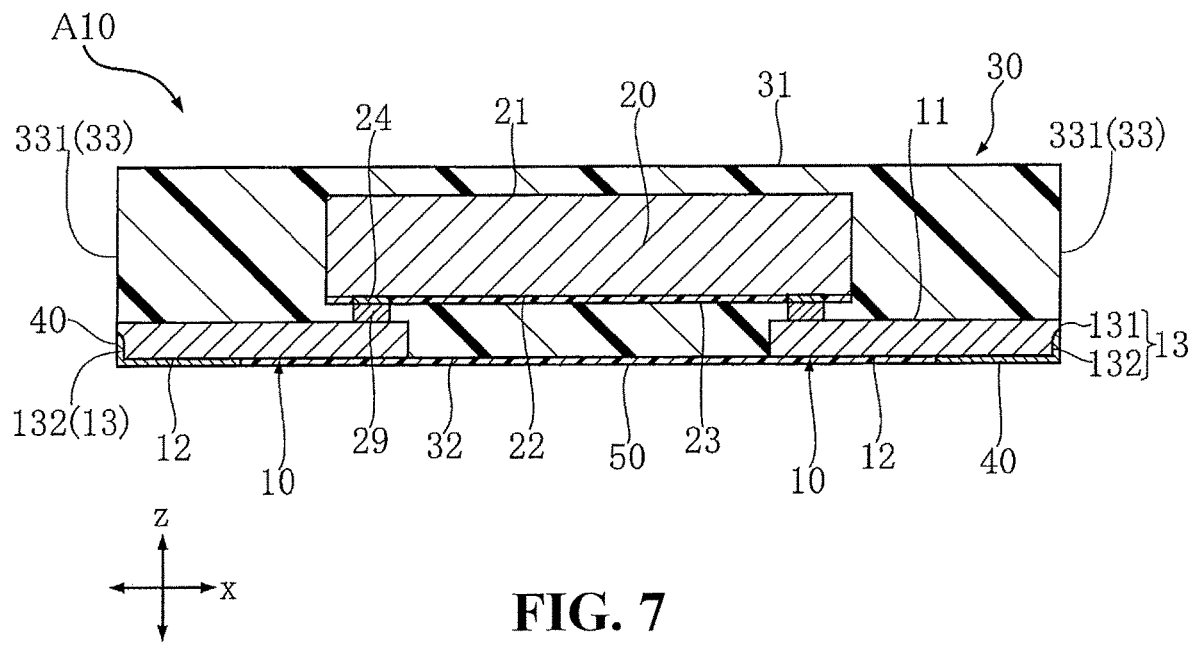
FIG. 7 is a cross-sectional view taken along line VII-VII of FIG. 2.
Figure 8:
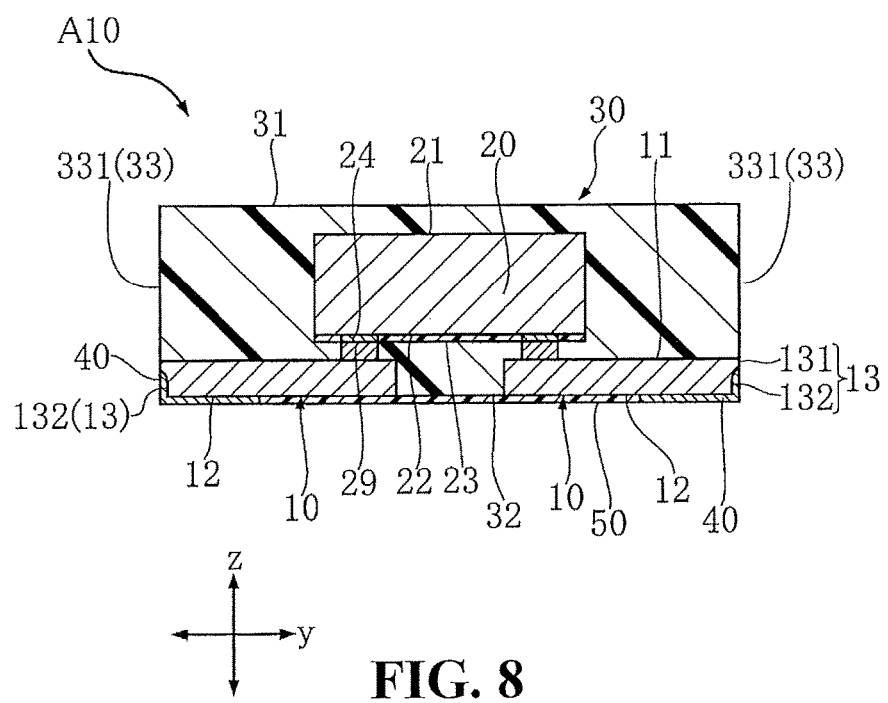
FIG. 8 is a cross-sectional view taken along line VIII-VIII of FIG. 2.

As shown in FIG. 1, FIG. 7 and FIG. 8, the sealing resin 30 is an electrical insulating component covering at least a portion of the conductive support 10 and the semiconductor element 20. The sealing resin 30 includes, for example, a black epoxy resin. The sealing resin 30 is formed by compression molding, for example. As shown in FIG. 5-FIG. 8, the sealing resin 30 includes: a resin main surface 31, a resin back surface 32 and a resin lateral surface 33. The resin main surface 31 faces toward the thickness direction z, and faces toward the same direction as the support surface 11 of the conductive support 10. The resin back surface 32 faces toward the thickness direction z, and the resin back surface 32 and the resin main surface 31 face toward opposite sides. When mounting the semiconductor device A10 on the wiring substrate, the resin back surface 32 and the wiring substrate face to each other. The resin back surface 32 is covered by the insulating film 50. Hence, the resin back surface 32 cannot be viewed from outside the semiconductor device A10. The resin lateral surface 33 intersects with both the resin main surface 31 and the resin back surface 32. The resin main surface 31 and the resin lateral surface 33 are exposed to outside the semiconductor device A10. As shown in FIG. 4-FIG. 6, the resin lateral surface 33 includes a resin outer surface 331 and a resin inner surface 332. The resin outer surface 331 intersects with the resin main surface 31 of the sealing resin 30. The resin inner surface 332 is recessed from the resin outer surface 331 toward an inner portion of the sealing resin 30 (toward any one of the first direction x and the second direction y), and intersects with both the resin outer surface 331 and the resin back surface 32 of the sealing resin 30.

As shown in FIG. 4-FIG. 8, the external terminal 40 is a conductive component electrically conducted to the mounting surface 12 of the conductive support 10, and exposed to outside of the semiconductor device A10. When mounting the semiconductor device A10 on the wiring substrate, solder is attached to the external terminal 40. The external terminal 40 is connected to and laminated with both at least a portion of the mounting surface 12 and the end surface 13 of the conductive support 10. As shown in FIG. 10, in the present embodiment, the external terminal 40 is connected to and laminated with the inner end surface 132 of the end surface 13. The external terminal 40 is across and laminated on a boundary B between the mounting surface 12 and the end surface 13.

As the first variation (a semiconductor device A11) of the semiconductor device A10, the configuration of the conductive support 10, the sealing resin 30 and the external terminal 40 shown in FIG. 11 can be used. In this case, the conductive support 10 is the configuration without the outer end surface 131 and the inner end surface 132. The end surface 13 is coplanar with the resin inner surface 332 of the sealing resin 30. Further, the external terminal 40 is connected to and laminated with the whole of the end surface 13. In the semiconductor device A11, it is ensured that an extension of the external terminal 40 in the thickness direction z is longer than the semiconductor device A10.

As the second variation (a semiconductor device A12) of the semiconductor device A10, the configuration of the conductive support 10, the sealing resin 30 and the external terminal 40 shown in FIG. 12 can be used. In this case, the inner end surface 132 of the end surface 13 of the conductive support 10 is disposed on the inner side of the conductive support 10 with respect to the inner end surface 132 of the semiconductor device A10. Hence, the external terminal 40 connected to and laminated with the inner end surface 132 is disposed closer to the inner side of the conductive support 10 than the outer end surface 131 of the end surface 13 except a portion of regions of the external terminal 40.

As the third variation (a semiconductor device A13) of the semiconductor device A10, the configuration of the conductive support 10, the sealing resin 30 and the external terminal 40 shown in FIG. 13 can be used. In this case, the inner surface 332 of the resin lateral surface 33 of the sealing resin 30 is disposed on the inner side of the sealing resin 30 with respect to the resin inner surface 332 of the semiconductor device A11. Hence, the external terminal 40 connected to and laminated with the end surface 13 is disposed closer to the inner side of the sealing resin 30 than the resin outer surface 331 of the resin lateral surface 33.

The external terminal 40 includes a Ni layer and an Au layer. The external terminal 40 is formed by electroless plating. Therefore, the Ni layer includes P. The external terminal 40 includes a Ni layer connected to both the mounting layer 12 and the end surface 13 and an Au layer connected to the Ni layer. Further, the external terminal 40 can also include a Ni layer connected to both the mounting layer 12 and the end surface 13, a Pd layer connected to the Ni layer, and an Au layer connected to the Pd layer. As shown in FIG. 4, in the present embodiment, the external terminal 40 is laminated with a plurality of areas of the mounting surface 12. Hence, the external terminal 40 has a plurality of areas, and the position of each area is corresponding to the position of each area of the mounting surface 12.

As shown in FIG. 5 to FIG. 9, the insulating film 50 is configured to be connected to both a portion of the mounting surface 12 of the conductive support 10 and the resin back surface 32 of the sealing resin 30. The insulating film 50 has electrical insulating properties, and includes polyimide, for example. The insulating film 50 is formed with a plurality of openings 51. The external terminal 40 is exposed to the outside of the semiconductor device A10 from the plurality of openings 51. Hence, the position of each opening 51 is corresponding to each area of the external terminal 40. Further, the insulating film 50 can also be omitted.

Then, based on FIG. 14 to FIG. 17, an example of a method for forming the external terminal 40 of the semiconductor device A10 is illustrated.

Figure 14:
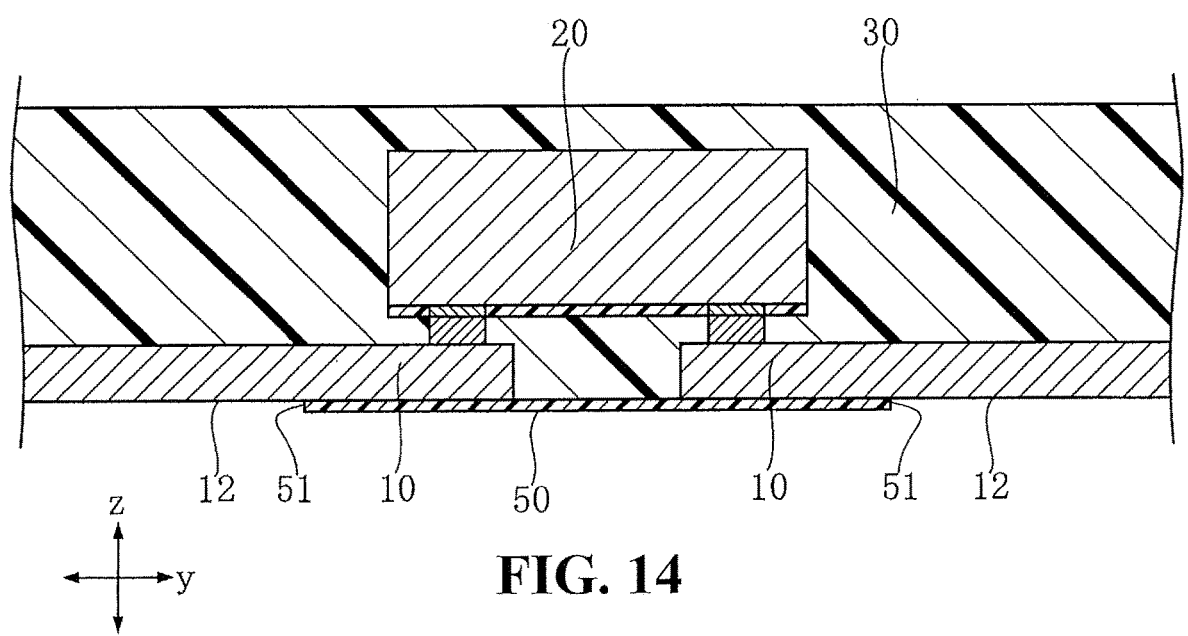
FIG. 14 is a cross-sectional view showing a method for forming the external terminal of the semiconductor device shown in FIG. 1.

FIG. 14 shows the case where the sealing resin 30 and the insulating film 50 are respectively formed on the conductive support 10, which is formed by electrolytic plating and having the semiconductor element 20 mounted thereon. A plurality of openings 51 are formed on the insulating film 50, and the area of the mounting surface 12 of the conductive support 10 is exposed from each opening 51.

Figure 15:
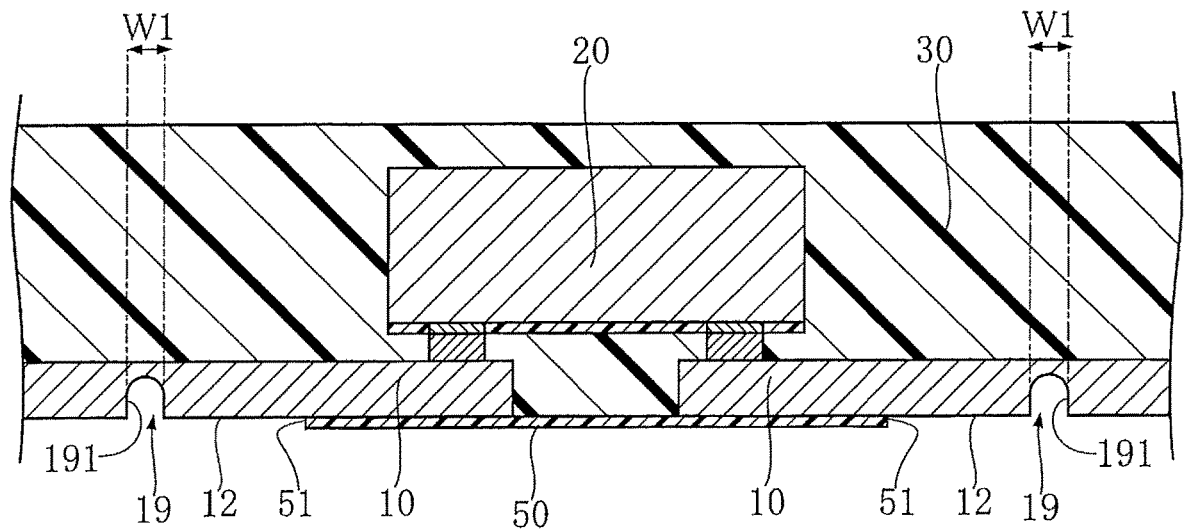
FIG. 15 is a cross-sectional view showing a method for forming the external terminal of the semiconductor device shown in FIG. 1.

Then, as shown in FIG. 15, a groove 19 is formed on the conductive support 10 and the sealing resin 30 and recessed from the mounting surface 12 of the conductive support 10 toward the thickness direction z. The groove 19 is formed in the manner that the groove 19 is recessed from the area of the mounting surface 12 exposed from the plurality of openings 51 of the insulating film 50, and is formed along both the first direction x and the second direction y. During the groove 19 is formed, a dicing saw is used, for example. With the formation of the grooves 19, a portion of each of the conductive support 10 and the sealing resin 30 is removed. In the present embodiment, the groove 19 is formed with a width W1 (the length in the first direction x or the second direction y) shown in FIG. 15, and is formed in the manner that the front end of the groove 19 does not reach the support surface 11 of the conductive support 10. By forming the groove 19, a groove inner surface 191 is formed on the conductive support 10 to intersect with the mounting surface 12.

Figure 16:
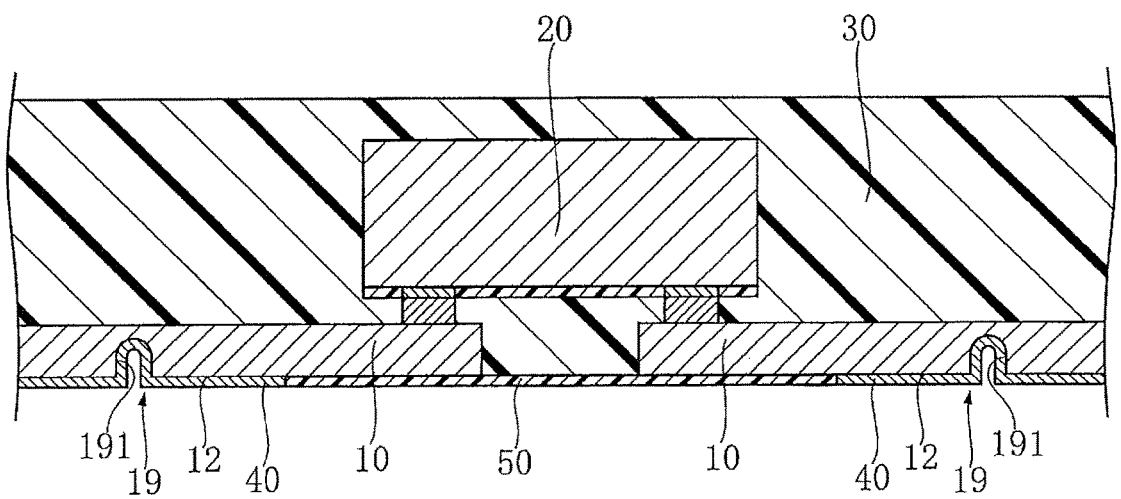
FIG. 16 is a cross-sectional view showing a method for forming the external terminal of the semiconductor device shown in FIG. 1.

Then, as shown in FIG. 16, the external terminal 40 is formed to be connected to the mounting surface 12 of the conductive support 10 exposed to the outside and the groove inner surface 191. The external terminal 40 is formed by depositing a plurality of metal layers using electroless plating. Further, the specific configuration of the metal layer is as described above.

Figure 17:
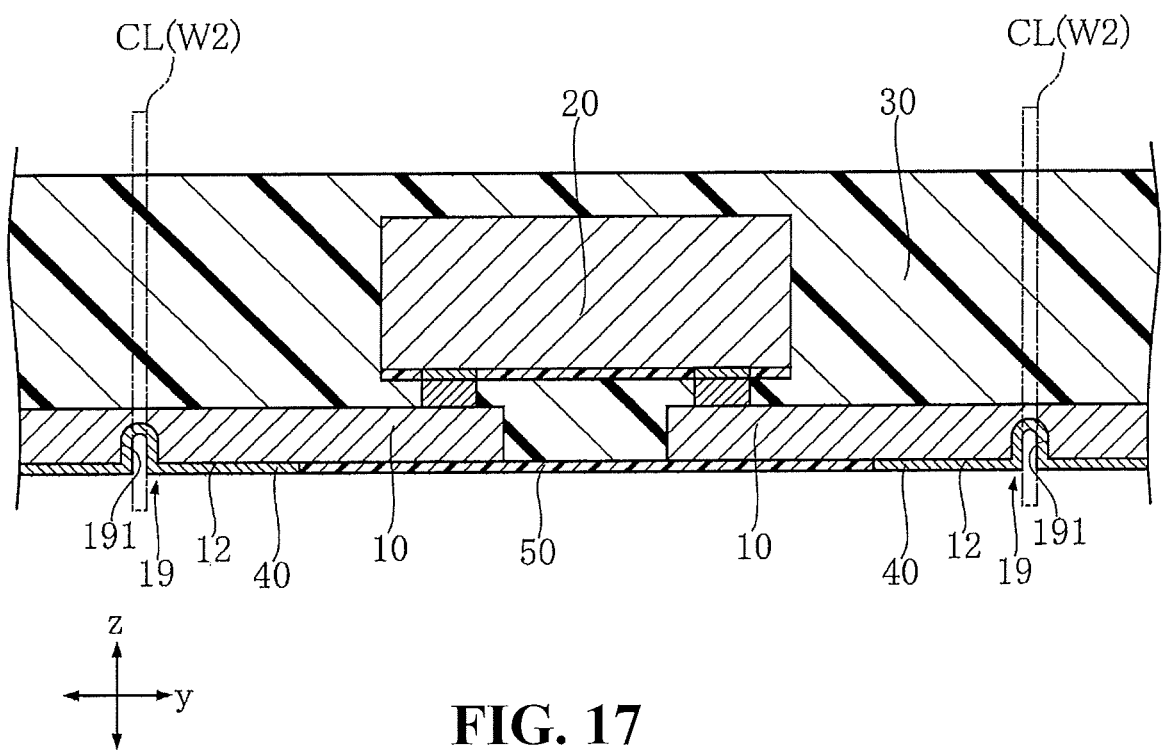
FIG. 17 is a cross-sectional view showing a method for forming the external terminal of the semiconductor device shown in FIG. 1.

Then, as shown in FIG. 17, the conductive support 10 and the sealing resin 30 are cut along both the first direction x and the second direction y through the groove 19, and are cut into individual pieces including the semiconductor element 20. During the conductive support 10 and the sealing resin 30 are cut, a dicing saw is used, for example. For example, when the conductive support 10 and the sealing resin 30 are cut along the first direction x, the region surrounded by the cutting line CL shown in FIG. 17 is removed. In this case, the width W2 of the cutting line CL (the length in the second direction y) is shorter than the width W1 of the groove 19 shown in FIG. 15. By cutting the conductive support 10 and the sealing resin 30, an outer end surface 131 is formed on the conductive support 10, and a resin outer surface 331 is formed on the sealing resin 30. Further, the residual groove inner surface 191 of the conductive support 10 due to the cut is corresponding to the inner end surface 132 of the conductive support 10 and the resin inner surface 332 of the sealing resin 30. The individual piece including the semiconductor element 20 cut in such step becomes the semiconductor device A10. Further, in the case that the front end of the groove 19 is formed so as to reach the support surface 11 of the conductive support 10 in the step of forming the groove 19 shown in FIG. 15, the configuration of the semiconductor device A11 shown in FIG. 11 can be obtained. Further, in the step of forming the groove 19 shown in FIG. 15, if the width W1 is set to be larger, the configuration of the semiconductor device A12 shown in FIG. 12 or the semiconductor device A13 shown in FIG. 13 can be obtained.

Then, the effects of the semiconductor device A10 are illustrated.

The semiconductor device A10 includes an external terminal 40. The external terminal 40 is electrically conducted to the mounting surface 12 of the conductive support 10 and exposed to the outside, and includes the Ni layer (having P) formed by electroless plating and the Au layer. Hence, the wettability of the solder to the external terminal 40 becomes good. Further, the external terminal 40 is connected to and laminated with at least a portion of each of the mounting surface 12 of the conductive support 10 and the end surface 13. By using this configuration, the formation of welding fillets is facilitated at the external terminal 40 laminated on the end surface 13 of the conductive support 10. Therefore, the mounting strength of the semiconductor device A10 to the wiring substrate is further improved. Hence, according to the semiconductor device A10, miniaturization can be achieved, and reduction of mountability to a wiring substrate is prevented.

The Ni layer and the Au layer included in the external terminal 40 are formed by electroless plating. Hence, in comparison with the case that the Ni layer and the Au layer are formed by electrolytic plating, the thickness of each layer (the length in the thickness direction z) can be significantly thinned. This case facilitates the further miniaturization (thickness reduction) of the semiconductor device A10.

For the configuration of the external terminal 40, in the case that the Pd layer is disposed between the Ni layer connected to the mounting surface 12 of the conductive support 10 and the Au layer exposed from the surface, the wettability of the solder to the external terminal 40 is further improved. Therefore, the reduction of mountability of the semiconductor device A10 to the wiring substrate is prevented so as to increase mountability.

The semiconductor device A10 includes the insulating film 50. The insulating film 50 is configured to be connected to both a portion of the mounting surface 12 of the conductive support 10 and the resin back surface 32 of the sealing resin 30. By using this configuration, when the semiconductor device A10 is mounted on the wiring substrate, the occurrence of a short circuit due to the solder attached to the external terminal 40 can be prevented. Further, when the semiconductor device A10 is used, leakage current leaking from the semiconductor element 20 can be prevented. Further, the conductive support 10 can be prevented from detaching from the sealing resin 30.

The semiconductor device A10 includes the bonding layer 29. The bonding layer 29 is interposed between the support surface 11 of the conductive support 10 and the electrode 24 of the semiconductor element 20. The bonding layer 29 includes an alloy having Sn, and is formed by electrolytic plating. By using this configuration, when the electrode 24 is connected to the support surface 11 by flip chip bonding, there is no need to attach the solder to the electrode 24, and the electrode 24 can be accurately connected to the support surface 11.

Second Embodiment

Figure 20:
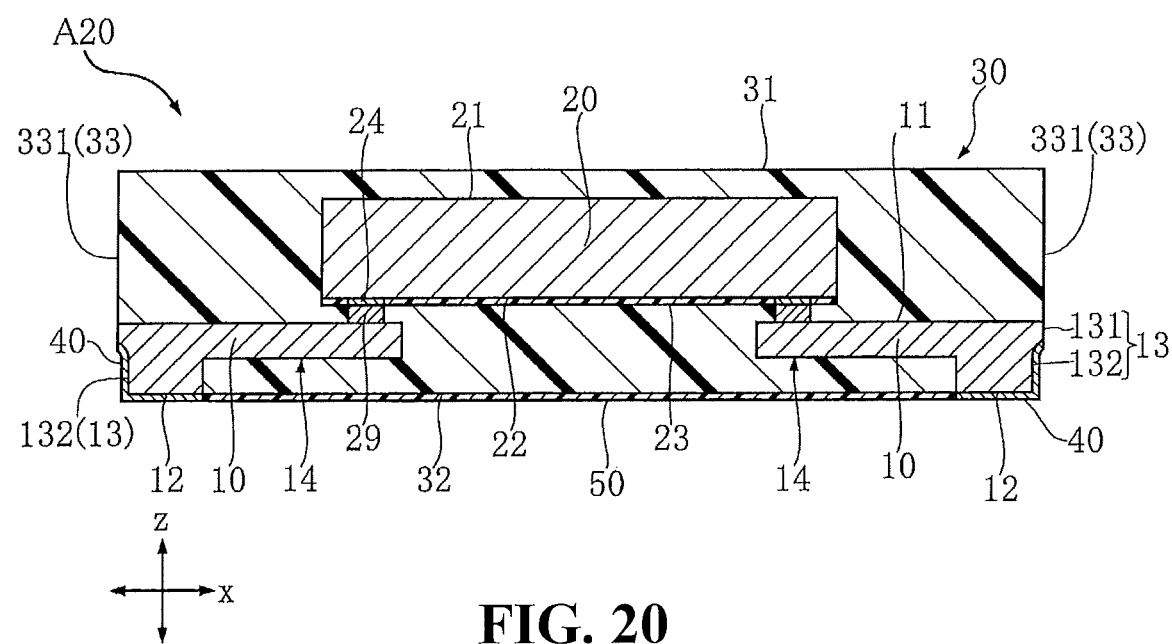
FIG. 20 is a cross-sectional view taken along line XX-XX of FIG. 18.
Figure 21:
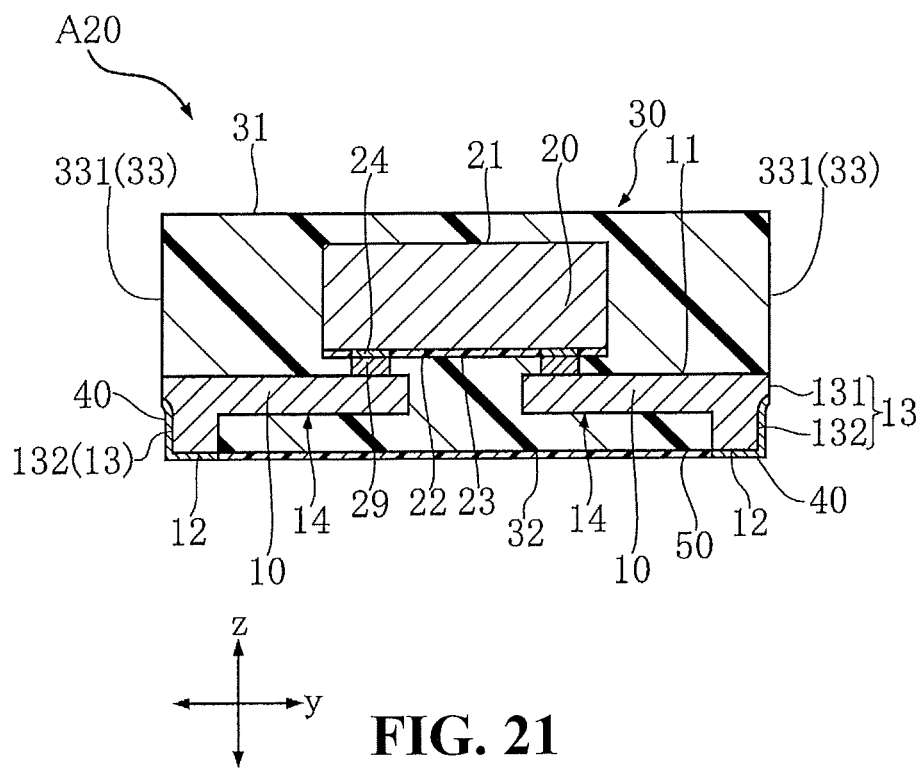
FIG. 21 is a cross-sectional view taken along line XXI-XXI of FIG. 18.
Figure 22:
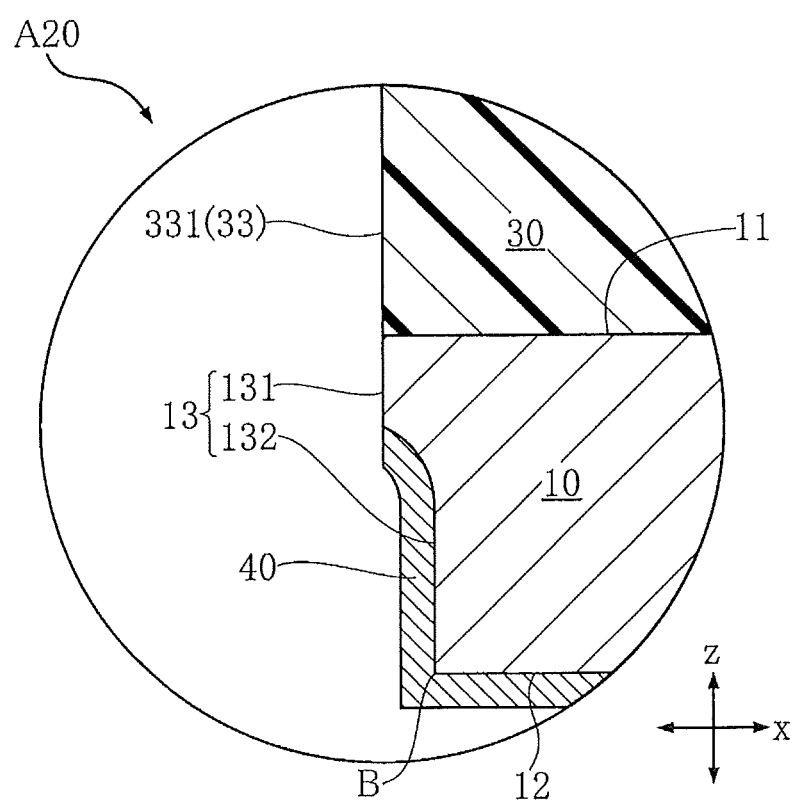
FIG. 22 is a partially enlarged view of FIG. 20 (near the end surface of the conductive support).
Figure 23:
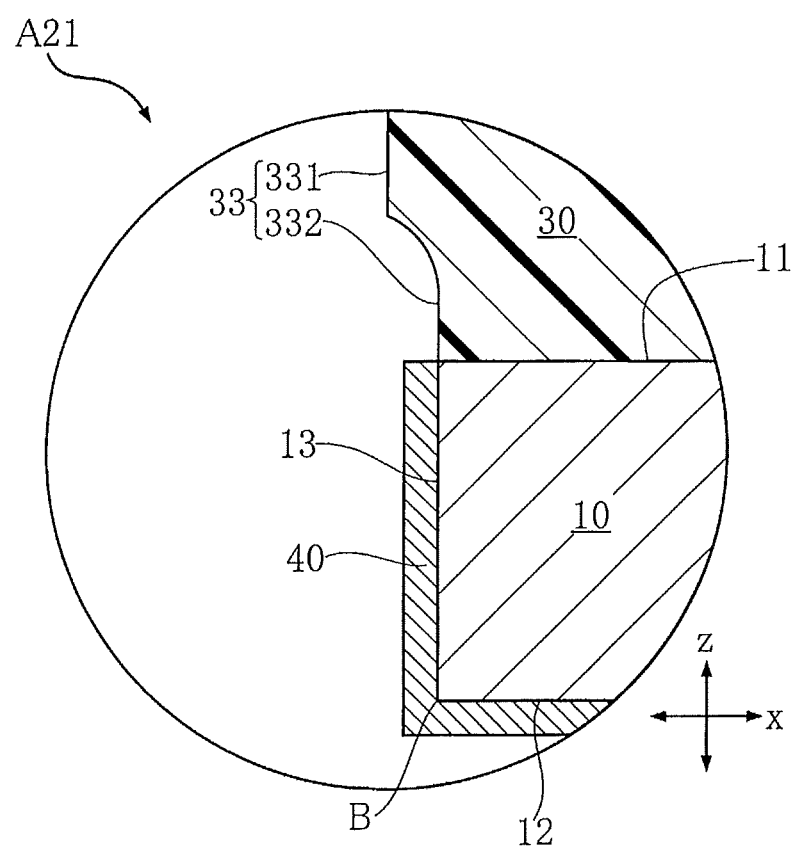
FIG. 23 is a partially enlarged view of a variation of the semiconductor device shown in FIG. 18 (near the end surface of the conductive support).

Based on FIG. 18 to FIG. 23, a semiconductor device A20 of the second embodiment of the present invention is illustrated. In these figures, elements the same as or similar to those of the above-described semiconductor device A10 are denoted by the same reference numerals, and duplicated explanations are omitted. Herein, for ease of understanding, the sealing resin 30 is seen through in FIG. 18. FIG. 21 is a cross-sectional view taken along line XXI-XXI of FIG. 18 (the one-dot-chain-line in FIG. 18). The range shown in FIG. 23 is the same as the range shown in FIG. 22.

Figure 18:
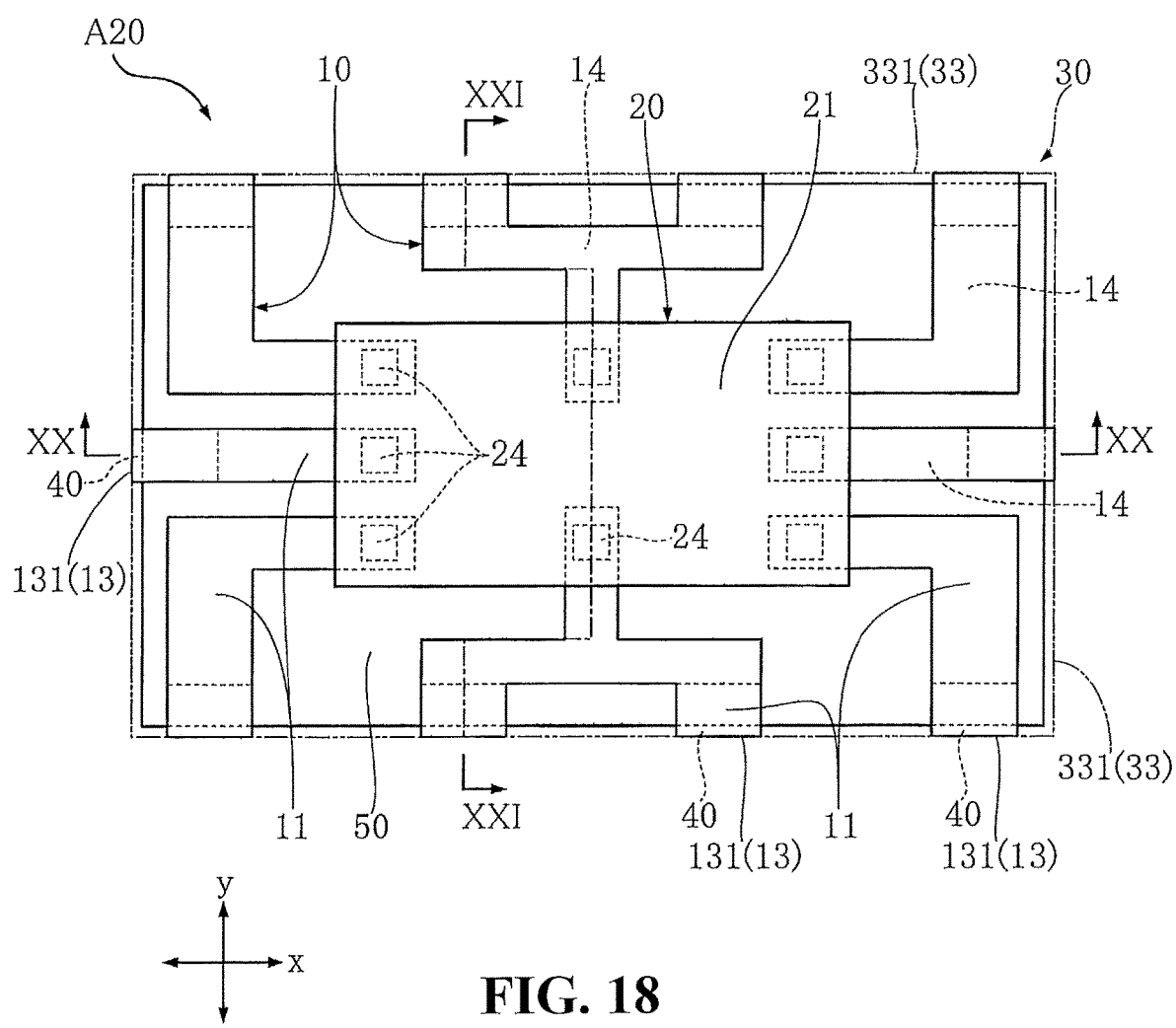
FIG. 18 is a top view showing a semiconductor device (through a sealing resin) according to the second embodiment of the present invention.
Figure 19:
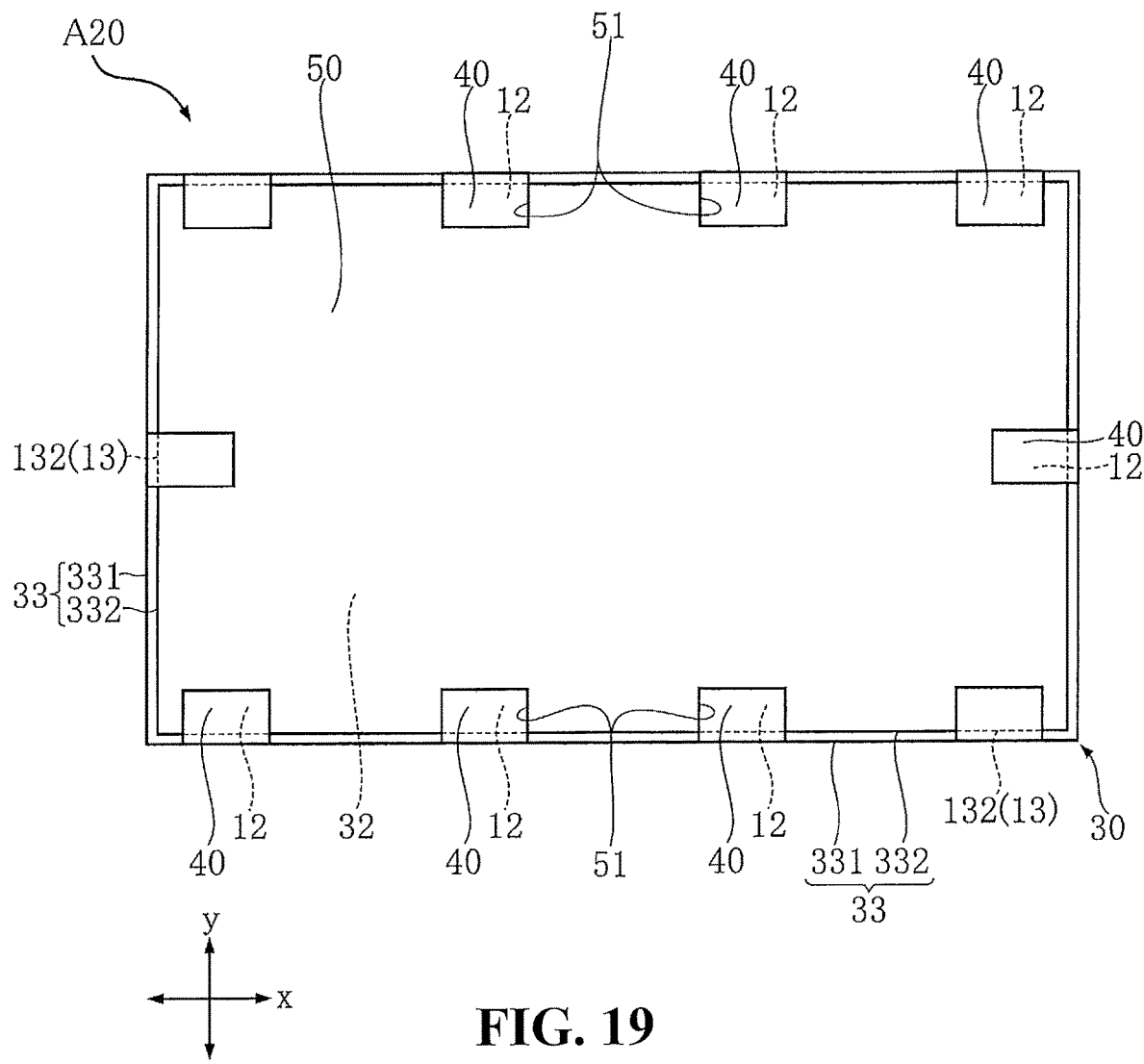
FIG. 19 is a bottom view showing the semiconductor device shown in FIG. 18.

The semiconductor device A20 has the configuration of a conductive support 10, a sealing resin 30, an external terminal 40 and an insulating film 50, and is different from the semiconductor device A10. Further, as shown in FIG. 18, the semiconductor device A20 is a rectangular shape in the top view.

In the present embodiment, the conductive support 10 is a conductive element made of a metal, and is made of a lead frame including Cu. As shown in FIG. 18 to FIG. 21 (except FIG. 19), in the present embodiment, the conductive support 10 is formed with a concave portion 14. The concave portion 14 is a portion recessed from the mounting surface 12 toward the thickness direction z. The sealing resin 30 is connected to the concave portion 14. Further, in addition to the alloy having Sn, the bonding layer 29 of the present embodiment also includes Ni. The Ni is connected to the support surface 11 of the conductive support 10.

As shown in FIG. 20 to FIG. 22, in the present embodiment, the external terminal 40 is connected to and laminated with both the whole of the mounting surface 12 of the conductive support 10 and a portion of the end surface 13. The end surface 13 of the conductive support 10 includes an outer end surface 131 and an inner end surface 132. The external terminal 40 is connected to and laminated with the inner end surface 132. In the present embodiment, as the variation of the semiconductor device A20 (semiconductor device A21), the configuration of the conductive support 10, the sealing resin 30 and the external terminal 40 shown in FIG. 23 can be used. In the configuration shown in FIG. 23, the external terminal 40 is connected to and laminated with both the whole of the mounting surface 12 and the whole of the end surface 13. Further, the external terminal 40 of the present embodiment can be formed by the same method as that for forming the external terminal 40 of the semiconductor device A10 (referring to Figure to FIG. 17).

As shown in FIG. 18 to FIG. 21, in the present embodiment, the insulating film 50 is configured to be connected to the resin back surface 32 of the sealing resin 30. The external terminal 40 is exposed from a plurality of openings 51 formed in the insulating film 50 to the outside of the semiconductor device A10.

Then, the effects of the semiconductor device A20 are illustrated.

The semiconductor device A20 is similar to the aforementioned semiconductor device A10, and includes the external terminal 40 having the Ni layer and the Au layer formed by electroless plating. Further, the external terminal 40 is connected to and laminated with the whole of the mounting surface 12 of the conductive support 10 and at least a portion of the end surface 13 of the conductive support 10. Hence, due to the semiconductor device A20, miniaturization can be achieved, and reduction of mountability to a wiring substrate is prevented.

In the semiconductor device A20, the conductive support 10 is made of a lead frame having Cu. By using this configuration, in comparison with the case that the conductive support 10 is formed by electrolytic plating as the semiconductor device A10, the step for forming the conductive support 10 can be made labor-saving, and the manufacturing efficiency can be improved. This case facilitates the reduction of fabrication cost of the semiconductor device A20.

On the conductive support 10 of the semiconductor device A20, a concave portion 14 is formed and recessed from the mounting surface 12 toward the thickness direction z. The sealing resin 30 is connected to the concave portion 14. By using this configuration, the following profile is used, i. e. the portion of the conductive support 10 which does not overlap the mounting surface 12 in the top view is clamped by the sealing resin 30 at two sides in the thickness direction z. If this profile is used, the conductive support 10 can be prevented from detaching from the sealing resin 30.

The semiconductor device A20 includes an insulating film 50 which is configured to be connected to a resin back surface 32 of the sealing resin 30. By using this configuration, the same effects as those of the semiconductor device A10 including the insulating film 50 are exhibited. Further, the conductive support 10 can be more effectively prevented from falling off from the sealing resin 30.

Third Embodiment

Figure 28:
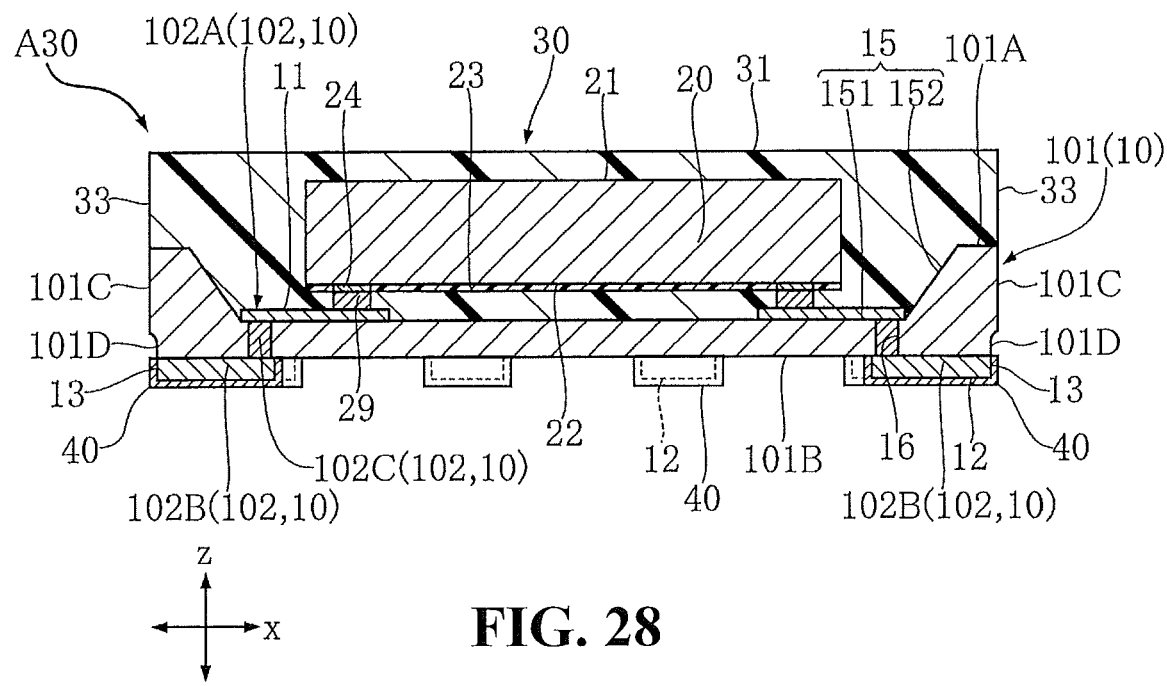
FIG. 28 is a cross-sectional view taken along line XXVIII-XXVIII of FIG. 24.
Figure 29:
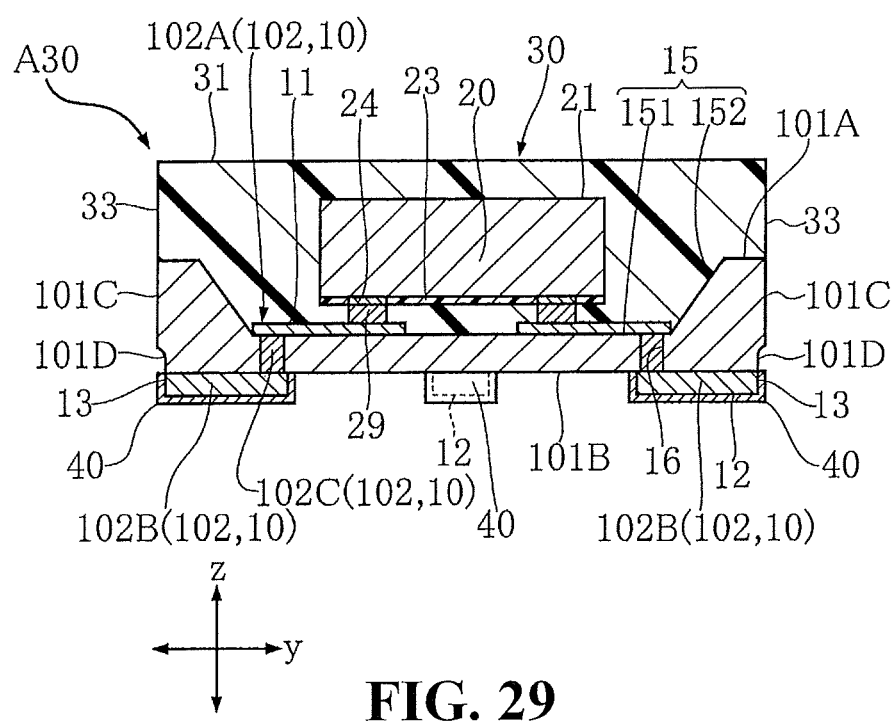
FIG. 29 is a cross-sectional view taken along line XXIX-XXIX of FIG. 24.
Figure 30:
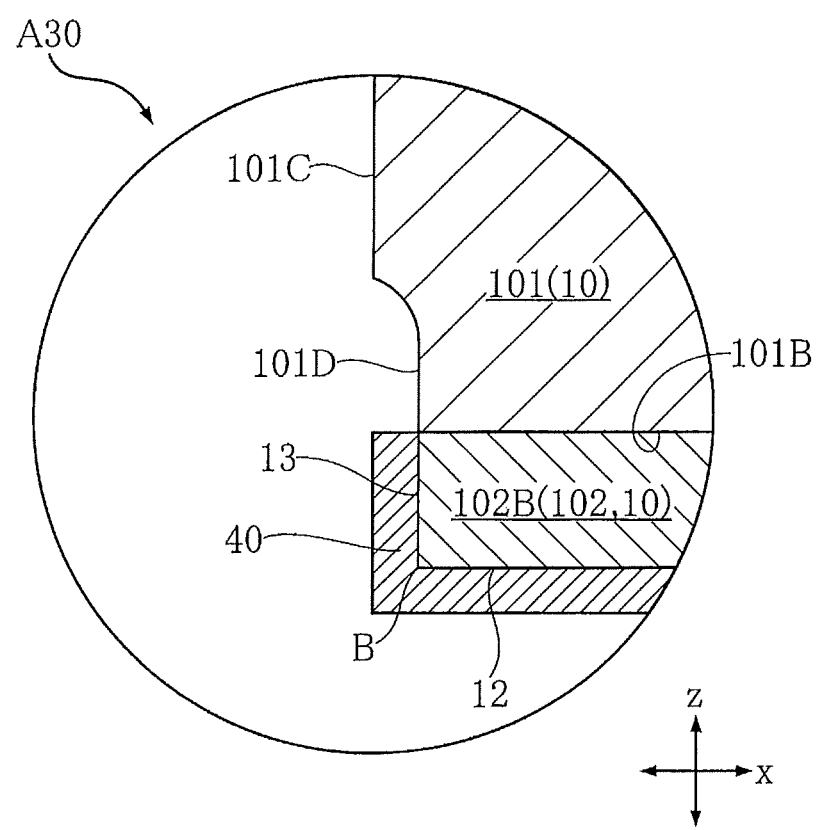
FIG. 30 is a partially enlarged view of FIG. 28 (near an inner surface of the substrate).
Figure 31:
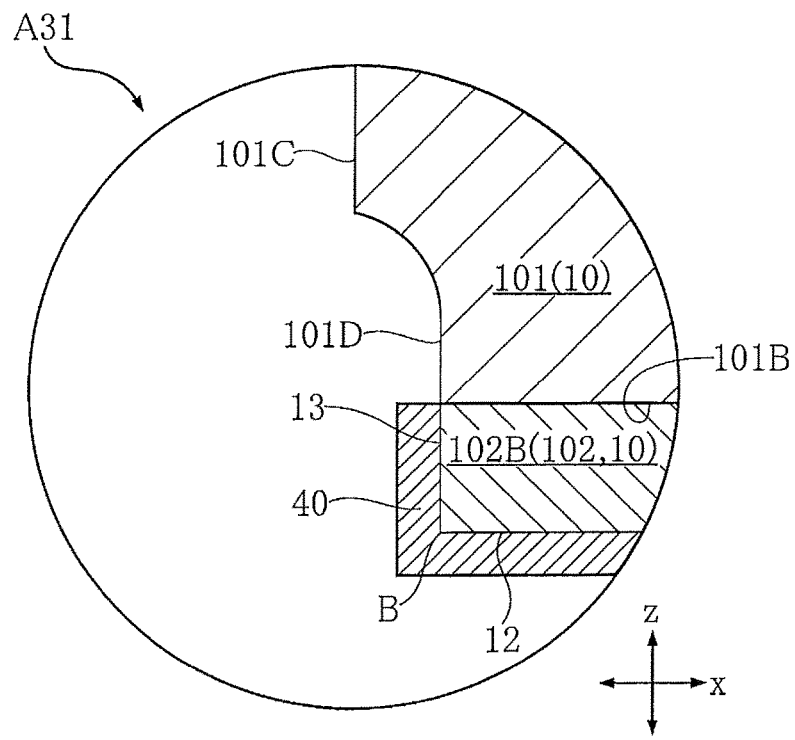
FIG. 31 is a partially enlarged view of the first variation of the semiconductor device shown in FIG. 24 (near the inner surface of the substrate).
Figure 32:
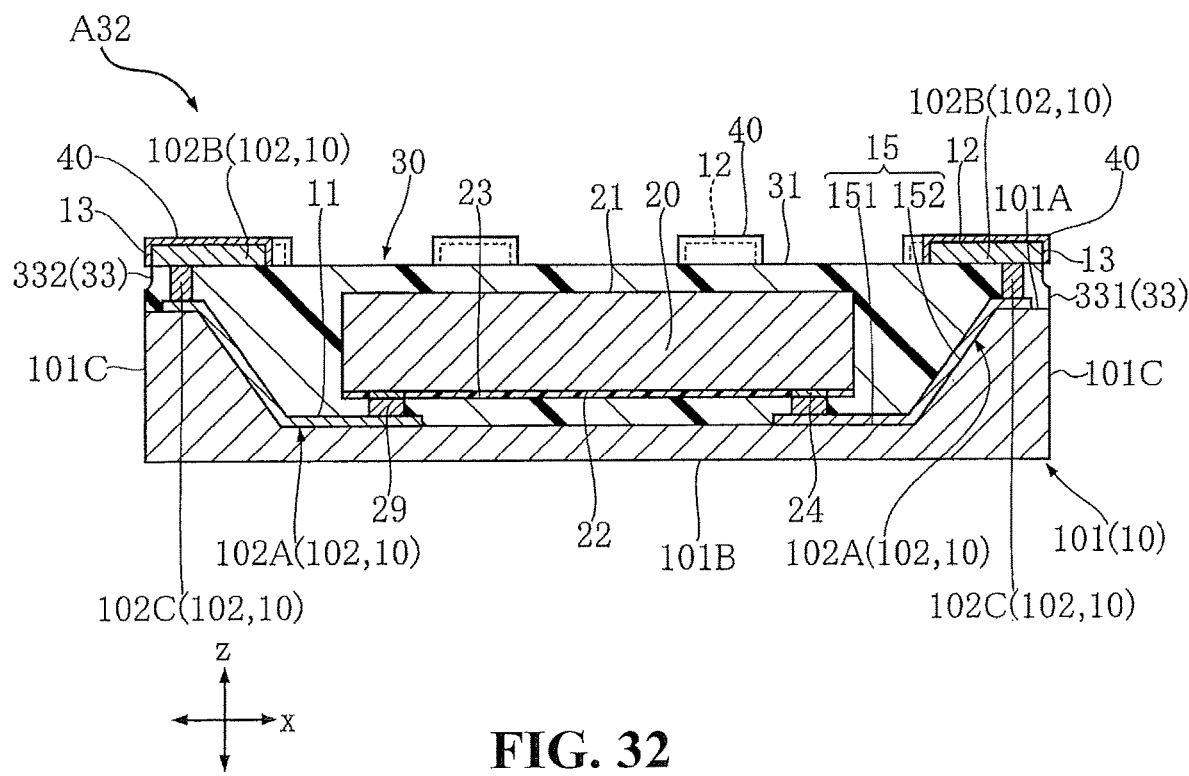
FIG. 32 is a cross-sectional view showing the second variation of the semiconductor device shown in FIG. 24.
Figure 33:
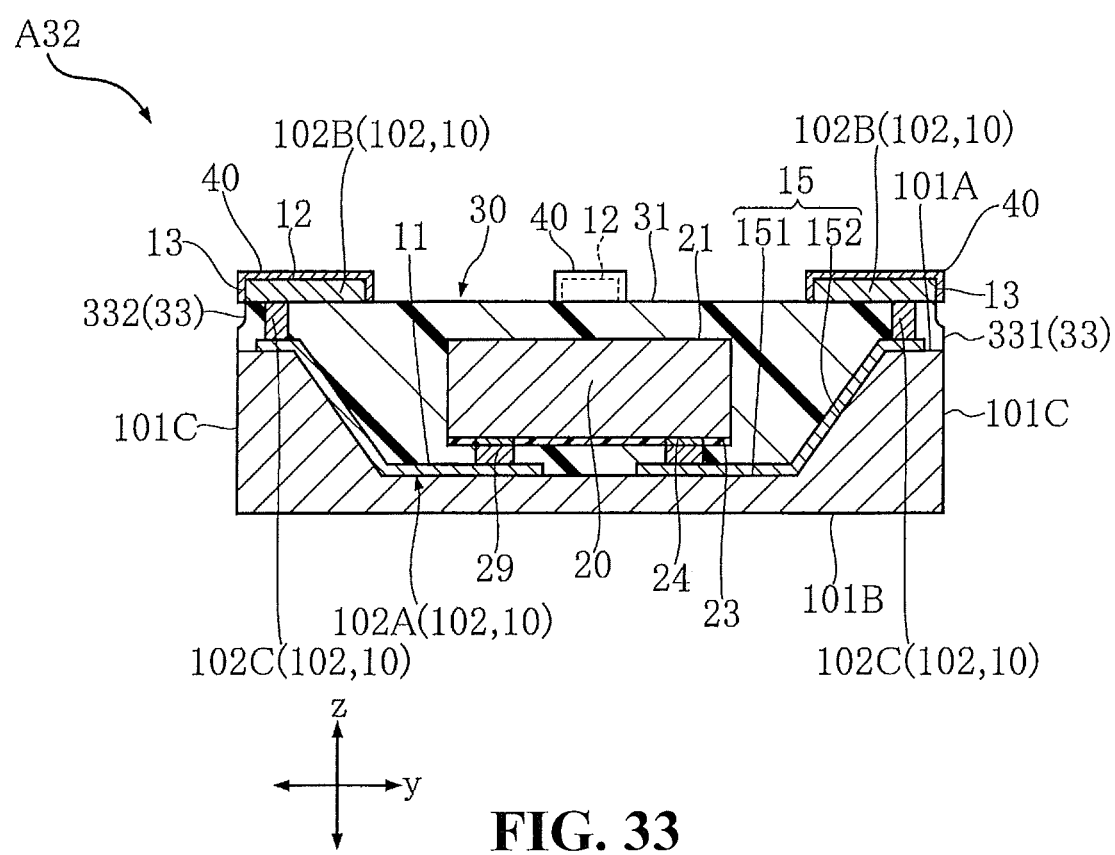
FIG. 33 is a cross-sectional view showing the second variation of the semiconductor device shown in FIG. 24.

Based on FIG. 24 to FIG. 33, a semiconductor device A30 of the third embodiment of the present invention is illustrated. In these figures, elements the same as or similar to those of the above-described semiconductor device A10 are denoted by the same reference numerals, and duplicated explanations are omitted. Herein, for ease of understanding, the sealing resin 30 is seen through in FIG. 24. FIG. 29 is a cross-sectional view taken along line XXIX-XXIX of FIG. 24 (the one-dot-chain-line in FIG. 24). The range shown in FIG. 31 is the same as the range shown in FIG. 30. FIG. 32 shows the same position of the cross-section as the position of the cross-section shown in FIG. 28. FIG. 33 shows the same position of the cross-section as the position of the cross-section shown in FIG. 29.

The semiconductor device A30 has the configuration of a conductive support 10, a sealing resin 30 and an external terminal 40, and is different from the semiconductor device A10. Further, the semiconductor device A30 is different from the semiconductor device A10, and is the configuration without an insulating film 50. Further, as shown in FIG. 24, the semiconductor device A30 is a rectangular shape in the top view.

As shown in FIG. 24 to FIG. 29, in the present embodiment, the conductive support 10 is configured to include a substrate 101 and a conductive layer 102. The conductive layer 102 is disposed on the substrate 101. The substrate 101 is made of a monocrystalline intrinsic semiconductor material. In the present embodiment, the intrinsic semiconductor material is Si. The substrate 101 has a main surface 101A, a back surface 101B, an outer surface 101C and an inner surface 101D. The substrate 101 is formed with a recess 15 and a through hole 16. Further, the conductive layer 102 has a support surface 11, a mounting surface 12 and an end surface 13. The conductive layer 102 includes a Ti layer and a Cu layer laminated with each other. The conductive layer 102 is formed by sputtering and electrolytic plating.

Figure 24:
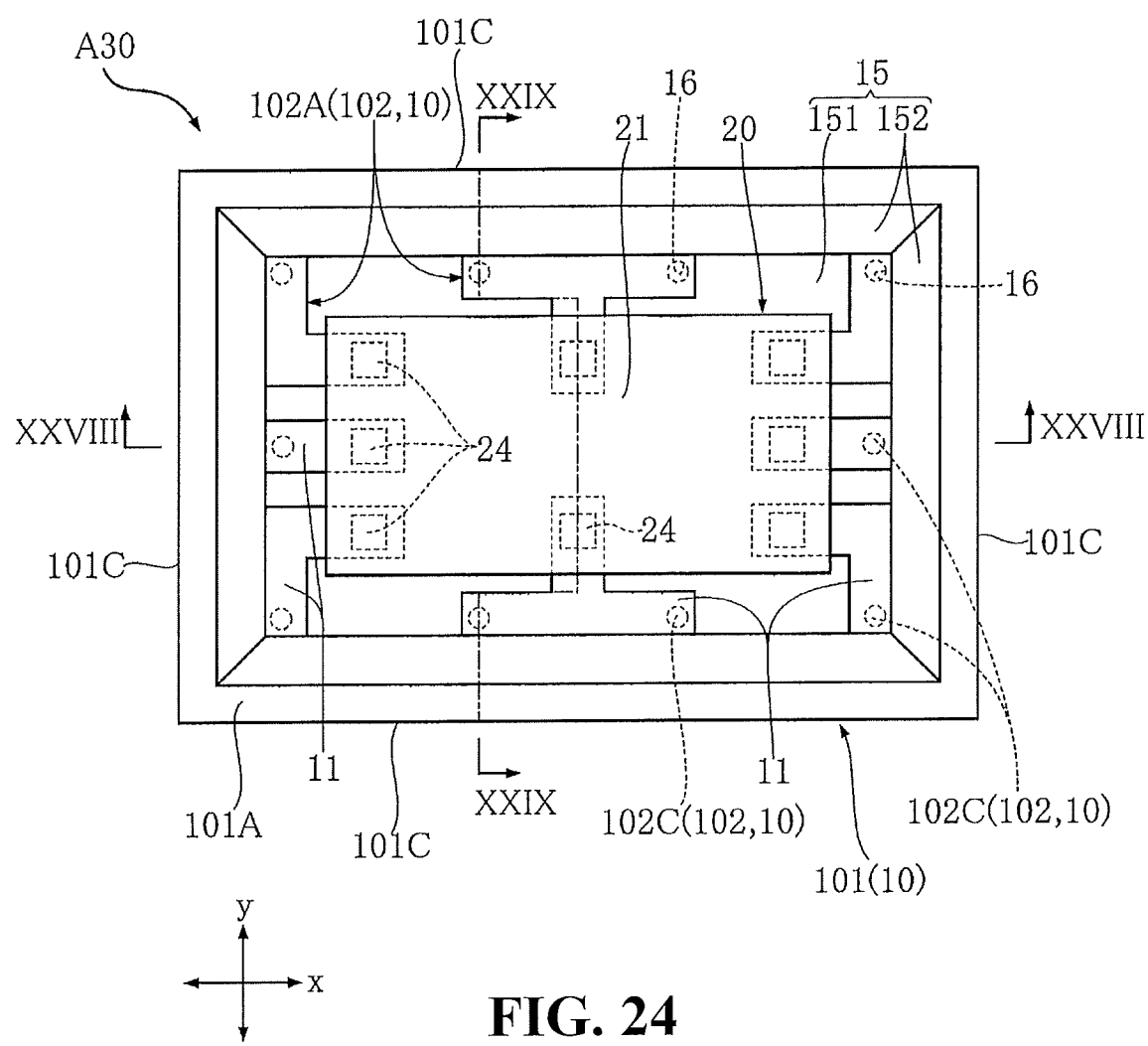
FIG. 24 is a top view showing a semiconductor device (through a sealing resin) according to the third embodiment of the present invention.
Figure 25:
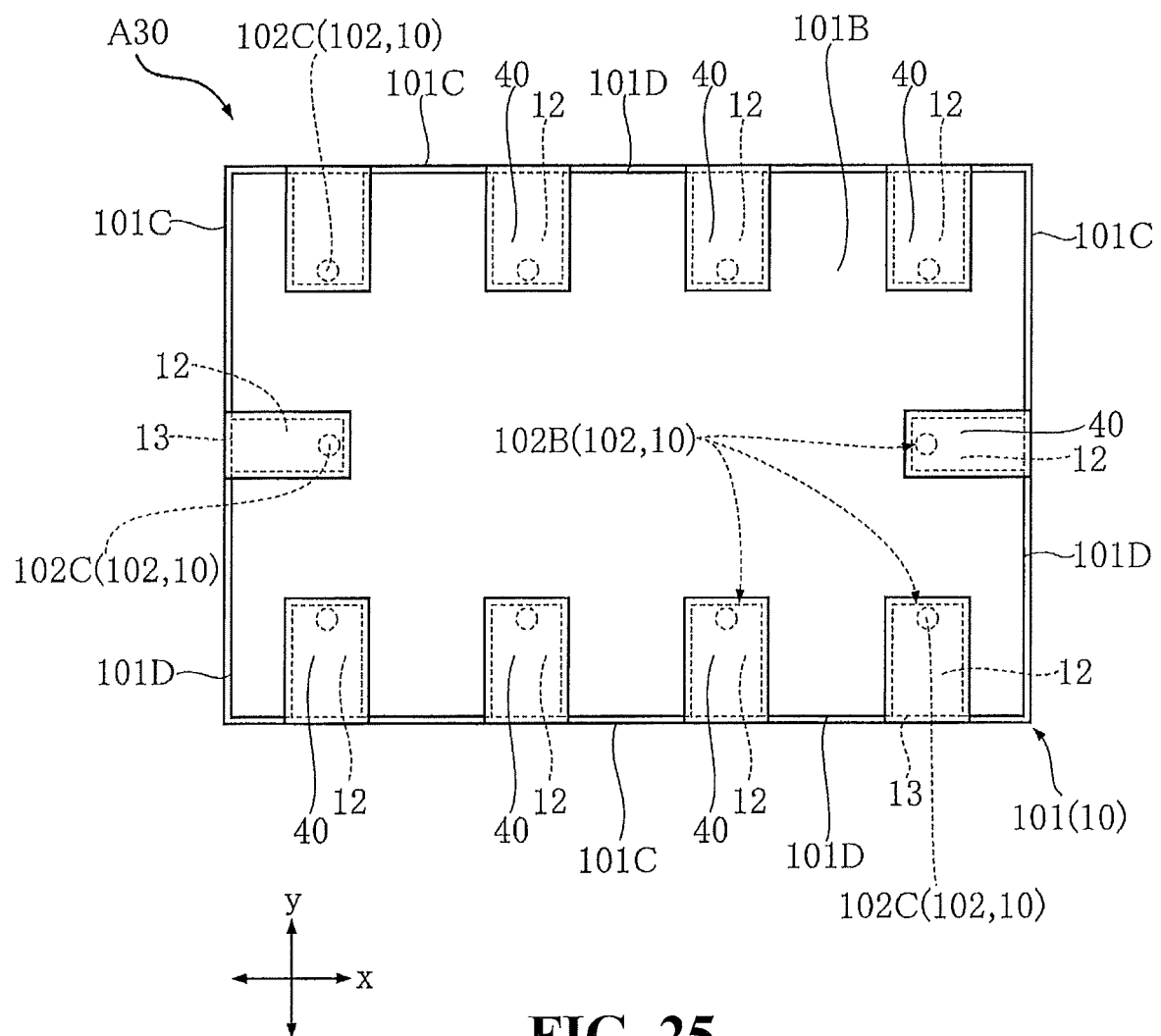
FIG. 25 is a top view of the semiconductor device shown in FIG. 24.
Figure 26:
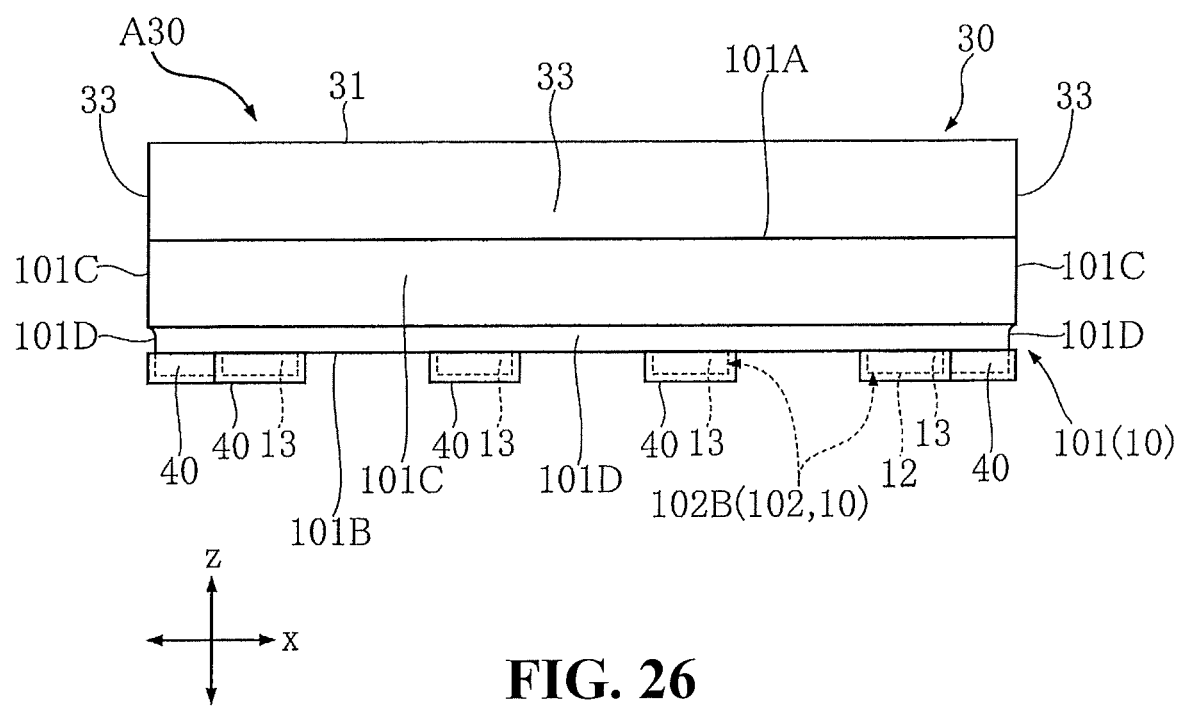
FIG. 26 is a front view of the semiconductor device shown in FIG. 24.
Figure 27:
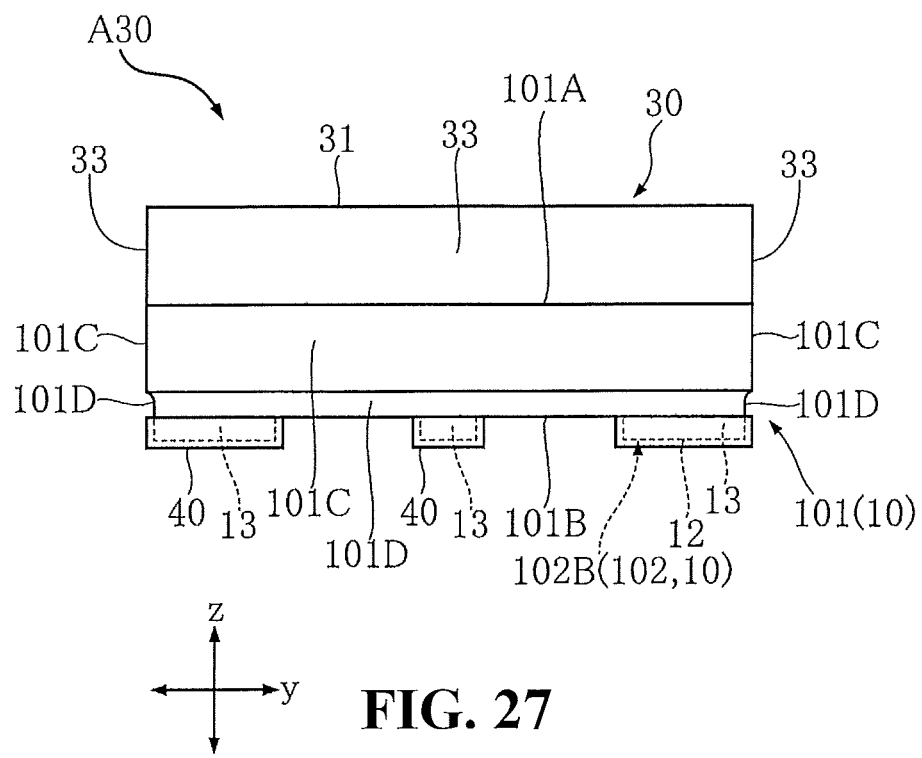
FIG. 27 is a right side view of the semiconductor device shown in FIG. 24.

As shown in FIG. 24, FIG. 28 and FIG. 29, the main surface 101A faces toward the same direction as the support surface 11 of the conductive layer 102. The main surface 101A is a frame surrounding the recess 15 in the top view. The main surface 101A is covered by the sealing resin 30. As shown in FIG. 25 to FIG. 29, the back surface 101B faces toward the same direction as the mounting surface 12 of the conductive layer 102. Hence, the main surface 101A and the back surface 101B face toward opposite sides in the thickness direction z. The back surface 101B is a rectangular shape, and exposed to the outside of the semiconductor device A30. When the semiconductor device A30 is mounted on the wiring substrate, the back surface 101B faces the wiring surface. A second conductive layer 102B of the conductive layer 102 is disposed on the back surface 101B (details will be described later).

As shown in FIG. 26 to FIG. 29, the outer surface 101C intersects with the main surface 101A. The outer surface 101C is coplanar with the resin lateral surface 33 of the sealing resin 30. The inner surface 101D is recessed from the outer surface 101C toward an inner portion of the substrate 101 (toward any one of the first direction x and the second direction y), and intersects with both the outer surface 101C and the back surface 101B. As shown in FIG. 30, the end portion of the inner surface 101D intersecting with the outer surface 101C is curved.

As shown in FIG. 24, FIG. 28 and FIG. 29, the recess 15 is formed on the substrate 101 and recessed from the main surface 101A toward the thickness direction z. The semiconductor element 20 is accommodated in the recess 15, and the sealing resin 30 is filled in the recess 15. The recess 15 includes a bottom surface 151 and an intermediate surface 152.

As shown in FIG. 24, FIG. 28 and FIG. 29, the bottom surface 151 is disposed between the main surface 101A and the back surface 101B in the thickness direction z, and is parallel with respect to the main surface 101A. The bottom surface 151 is a rectangular shape. A first conductive layer 102A of the conductive layer 102 is disposed on the bottom surface 151 (details will be described later).

As shown in FIG. 24, FIG. 28 and FIG. 29, the intermediate surface 152 is connected to both the bottom surface 151 and the main surface 101A, and is inclined with respect to the bottom surface 151. The intermediate surface 152 includes four regions surrounding the four sides which are the periphery of the bottom surface 151. Each of the regions has the same (54.74°) tilt angle with respect to the bottom surface 151. This is because in the substrate 101 made of the intrinsic semiconductor material, the main surface 101A is (100) plane, and the intermediate surface 152 is (111) plane.

As shown in FIG. 24, FIG. 28 and FIG. 29, a plurality of through holes 16 from the bottom surface 151 of the recess 15 to the back surface 101B in the thickness direction z are formed in the substrate 101. An intermediate conductive layer 102C of the conductive layer 102 is disposed inside the through hole 16 (details will be described later).

As shown in FIG. 24 to FIG. 29, the conductive layer 102 includes the first conductive layer 102A, the second conductive layer 102B and the intermediate conductive layer 102C. The first conductive layer 102A is disposed on the bottom surface 151 of the recess 15. The first conductive layer 102A includes the support surface 11, and the bonding layer 29 is disposed on the support surface 11. The semiconductor element 20 is connected to the support surface 11 of the first conductive layer 102A via the bonding layer 29.

The second conductive layer 102B is disposed on the back surface 101B. The second conductive layer 102B includes the mounting surface 12 and the end surface 13. As shown in FIG. 30, the end surface 13 of the second conductive layer 102B is coplanar with the inner surface 101D of the substrate 101. The second conductive layer 102B is covered by the external terminal 40. The intermediate conductive layer 102C is disposed inside the through hole 16. Two ends of the intermediate conductive layer 102C in the thickness direction z are connected to the first conductive layer 102A and the second conductive layer 102B. Hence, the intermediate layer 102C allows that the first conductive layer 102A and the second conductive layer 102B are electrically connected to each other. Further, the bonding layer 29 of the present embodiment includes the alloy having Sn and also includes Ni. The Ni is connected to the support surface 11 of the first conductive layer 102A.

As shown in FIG. 26 to FIG. 29, in the present embodiment, the sealing resin 30 is filled in the recess 15 of the conductive support 10, and covers the semiconductor element 20. Also, the main surface 101A of the substrate 101 and the first conductive layer 102A are covered by the sealing resin 30. Further, as shown in FIG. 25 to FIG. 29, in the present embodiment, the external terminal 40 is connected to and laminated with both the whole of the mounting surface 12 and the whole of the end surface 13.

As the first variation (a semiconductor device A31) of the semiconductor device A30, the configuration of the conductive support 10 (the substrate 101) and the external terminal 40 shown in FIG. 31 can be used. In this case, the inner surface 101D of the substrate 101 is disposed inside the substrate 101 with respect to the inner surface 101D of the semiconductor device A30. Hence, the external terminal 40 connected to and laminated with the end surface 13 of the conductive layer 102 (the second conductive layer 102B) is disposed closer to the inner side of the substrate 101 than the outer surface 101C of the substrate 101.

As the second variation (a semiconductor device A32) of the semiconductor device A30, the configuration of the conductive support 10 (the substrate 101 and the conductive layer 102) and sealing resin 30 shown in FIG. 32 and FIG. 33 can be used. In this variation, the substrate 11 has no inner surface 101D, and no through hole 16 is formed in the substrate 101. The first conductive layer 102A is not only disposed on the bottom surface 151 of the recess 15, but also disposed on the intermediate surface 152 of the recess 15 and the main surface 101A of the substrate 101. The second conductive layer 102B is disposed on the resin main surface 31 of the sealing resin 30. The intermediate conductive layer 102C extends from the first conductive layer 102A disposed on the main surface 101A toward the second conductive layer 102B, and is exposed from the resin main surface 31. Hence, the intermediate conductive layer 102C is covered by the sealing resin 30 except the region exposed from the resin main surface 31. The resin lateral surface 33 of the sealing resin 30 includes a resin outer surface 331 and a resin inner surface 332. Further, in this variation, the mounting surface 12 of the conductive layer 102 faces toward the same direction as the support surface 11.

Then, based on FIG. 34 to FIG. 44, an example of a method for forming the semiconductor device A30 is illustrated.

Figure 34:
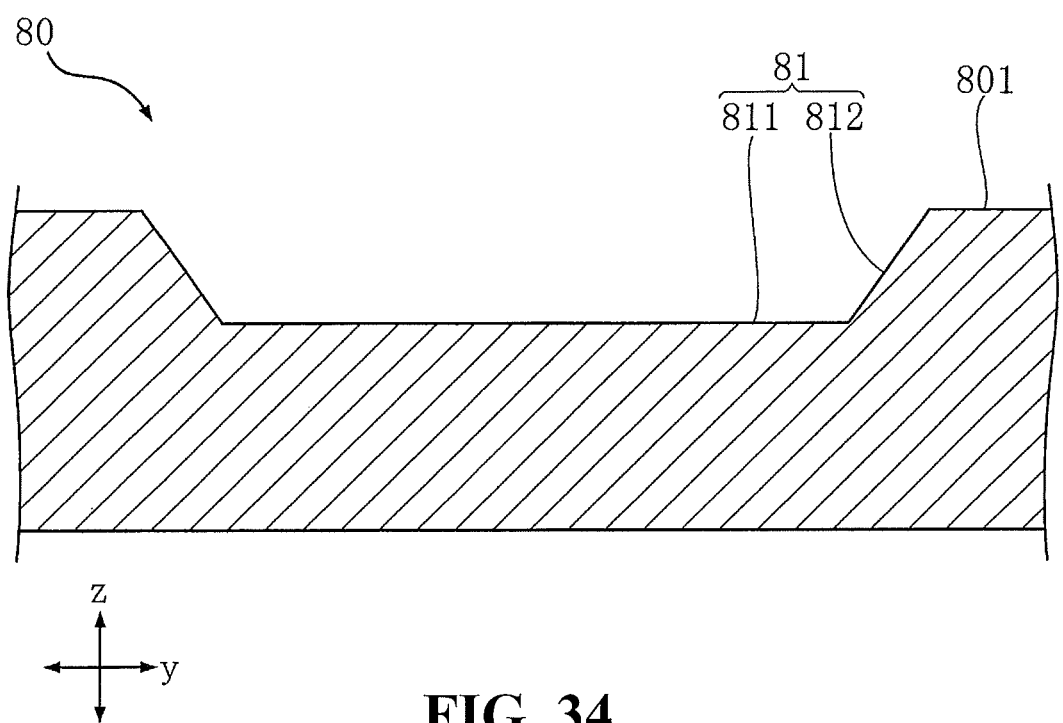
FIG. 34 is a cross-sectional view showing a method for forming the semiconductor device shown in FIG. 24.

First, as shown in FIG. 34, in the main surface 801 and the base material 80 made of a monocrystalline intrinsic semiconductor material, a recess 81 is formed and recessed from the main surface 801 toward the thickness direction z. The recess 81 is corresponding to the recess 15 formed in the substrate 101 of the semiconductor device A30. The base material 80 is an aggregation of the parts corresponding to the substrate 101 of the semiconductor device A30. The intrinsic semiconductor material is Si, for example, the base material 80 is a silicon wafer. In this case, the main surface 801 is (100) plane. The recess 81 is formed by crystal anisotropic etching using an alkaline solution. The alkaline solution is KOH (potassium hydroxide) solution or TMAH (tetramethylammonium hydroxide) solution, for example. By forming the recess 81 in the substrate 101, the bottom surface 811 and the intermediate surface 812 are exposed in the recess 81. In this case, the intermediate surface 812 is (111) plane, and is inclined at a specific angle (54.74°) with respect to the bottom surface 811.

Figure 35:
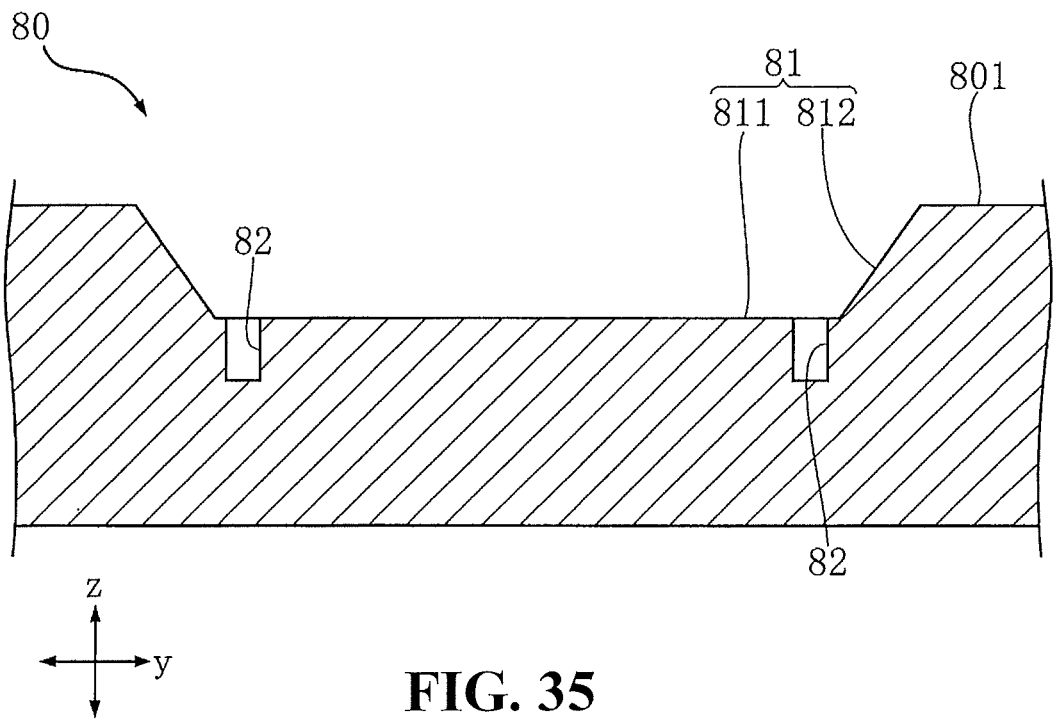
FIG. 35 is a cross-sectional view showing a method for forming the semiconductor device shown in FIG. 24.

Then, as shown in FIG. 35, a plurality of holes 82 from the bottom surface 811 of the recess 81 toward the thickness direction z are formed in the base material 80. The holes 82 are corresponding to the through holes 16 formed in the substrate 101 of the semiconductor device A30. The holes 82 are formed by deep reactive ion etching (RIE). Bosch process can be one of the examples of deep RIE. In this case, the holes 82 do not penetrate the base material 80 in the thickness direction z.

Figure 36:
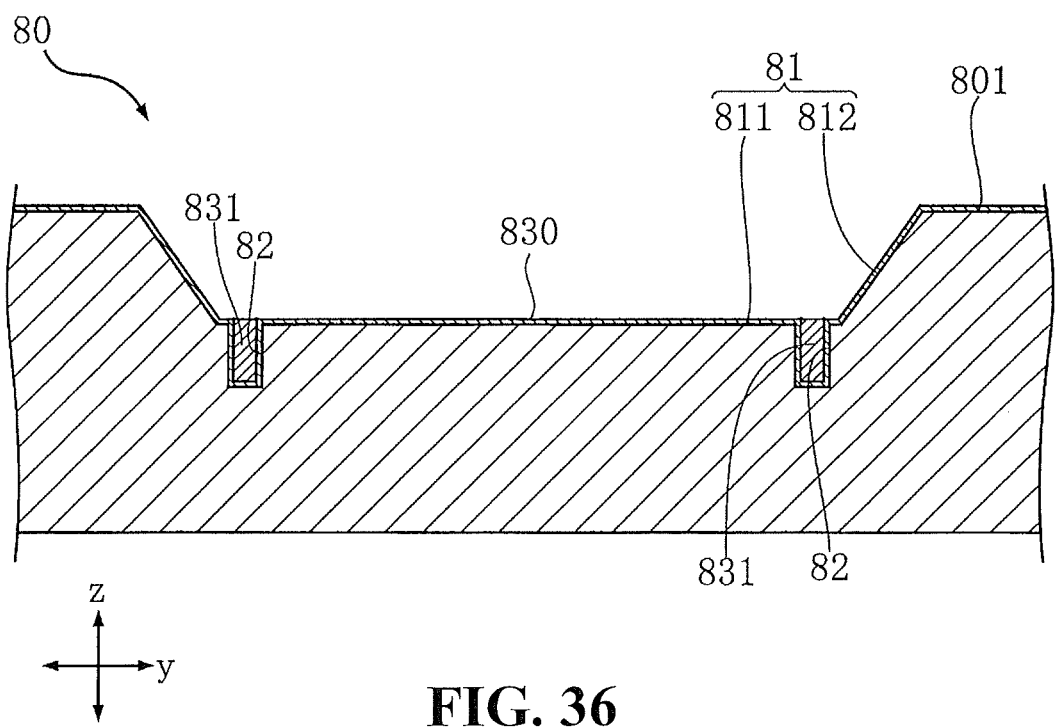
FIG. 36 is a cross-sectional view showing a method for forming the semiconductor device shown in FIG. 24.

Then, as shown in FIG. 36, after a base layer 830 is formed for covering the main surface 801, the recess 81 and inner surfaces of a plurality of holes 82, the intermediate conductive layer 831 is formed to fill in the inner portions of the holes 82. At this time, the base layer 830 formed inside the holes 82 and the intermediate conductive layer 831 are corresponding to the intermediate conductive layer 102C (the conductive layer 102) of the semiconductor device A30. The base layer 830 is formed by laminating a Ti layer and a Cu layer by sputtering. The intermediate conductive layer 831 is formed by depositing Cu by electrolytic plating using the base layer 830 as a conductive path after the mask is formed by photolithography.

Figure 37:
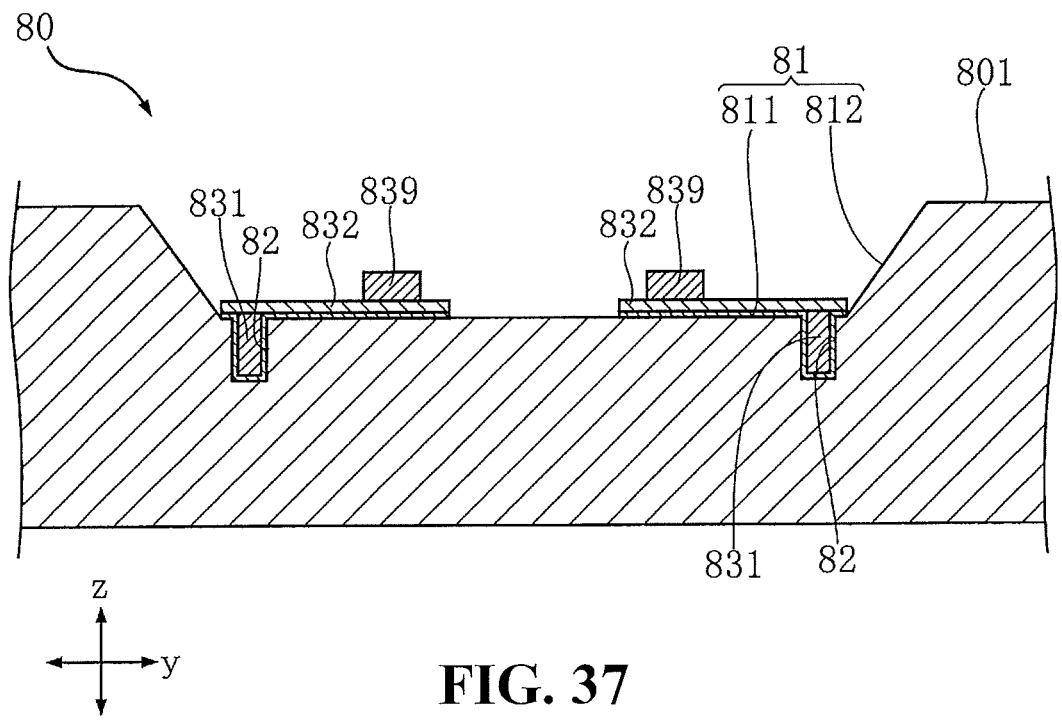
FIG. 37 is a cross-sectional view showing a method for forming the semiconductor device shown in FIG. 24.

Then, as shown in FIG. 37, after an internal conductive layer 832 and a bonding layer 839 are formed, the portion of the base layer 830 which is not covered by the internal conductive layer 832 is removed. The internal conductive layer 832 is formed on the bottom surface 811 of the recess 81 to be connected to the intermediate conductive layer 831. The internal conductive layer 832 is formed by the following manner, i.e. after the mask is formed by photolithography, Cu is deposited by electrolytic plating using the base layer 830 as a conductive path. Further, the bonding layer 839 is formed to be connected to the internal conductive layer 832. The bonding layer 839 is formed by the following manner, i.e. after the mask is formed by photolithography, the Ni layer and the alloy layer including Sn are laminated by electrolytic plating using the base layer 830 and the internal conductive layer 832 as a conductive path. The base layer 830 is removed by wet etching using a mixed solution of $H_2SO_4$ (sulfuric acid) and $H_2O_2$ (hydrogen peroxide), for example. At this time, the base layer 830 formed on the bottom surface 811 of the recess 81 and the internal conductive layer 832 are corresponding to the first conductive layer 102A (the conductive layer 102) of the semiconductor device A30.

Figure 38:
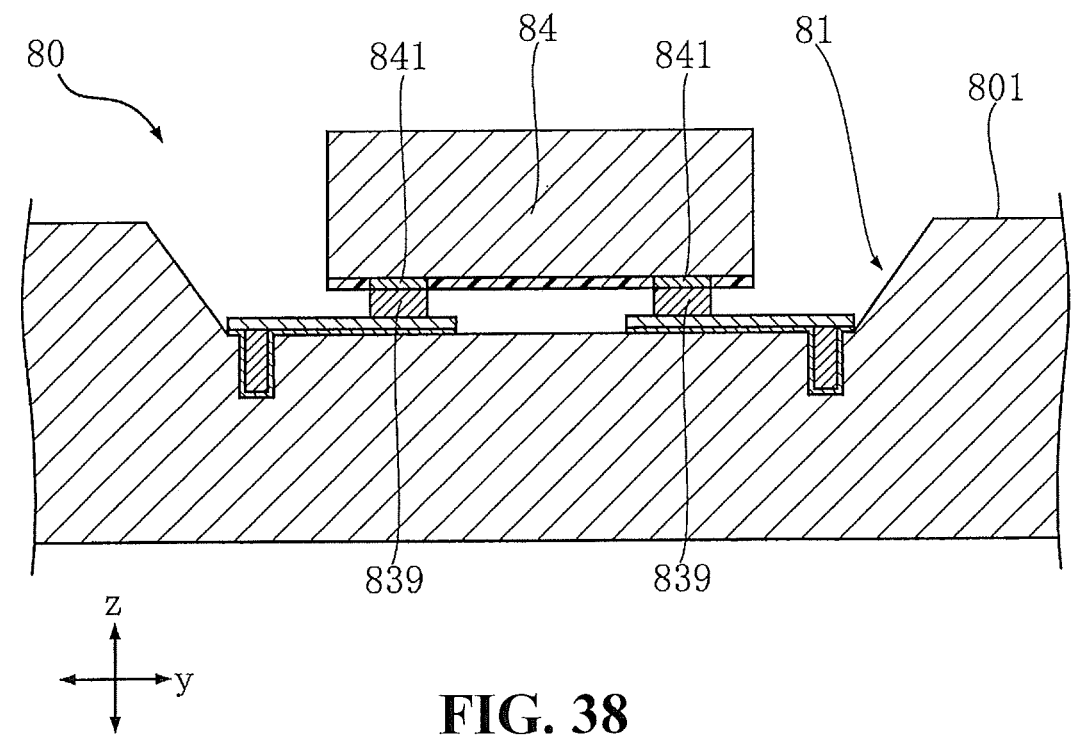
FIG. 38 is a cross-sectional view showing a method for forming the semiconductor device shown in FIG. 24.

Then, as shown in FIG. 38, the semiconductor element 84 is bonded to the bonding layer 839. The semiconductor element 84 is corresponding to the semiconductor element 20 of the semiconductor device A30. The bonding of the semiconductor element 84 to the bonding layer 839 is performed by flip chip bonding. After the solder is coated on an electrode 841 of the semiconductor element 84, the semiconductor element 84 is pre-mounted on the bonding layer 839 by a flip chip bonder. Then, after the bonding layer 839 is melted by reflow, the bonding layer 839 is solidified by cooling, such that the bonding of the semiconductor element 84 to the bonding layer 839 is completed.

Figure 39:
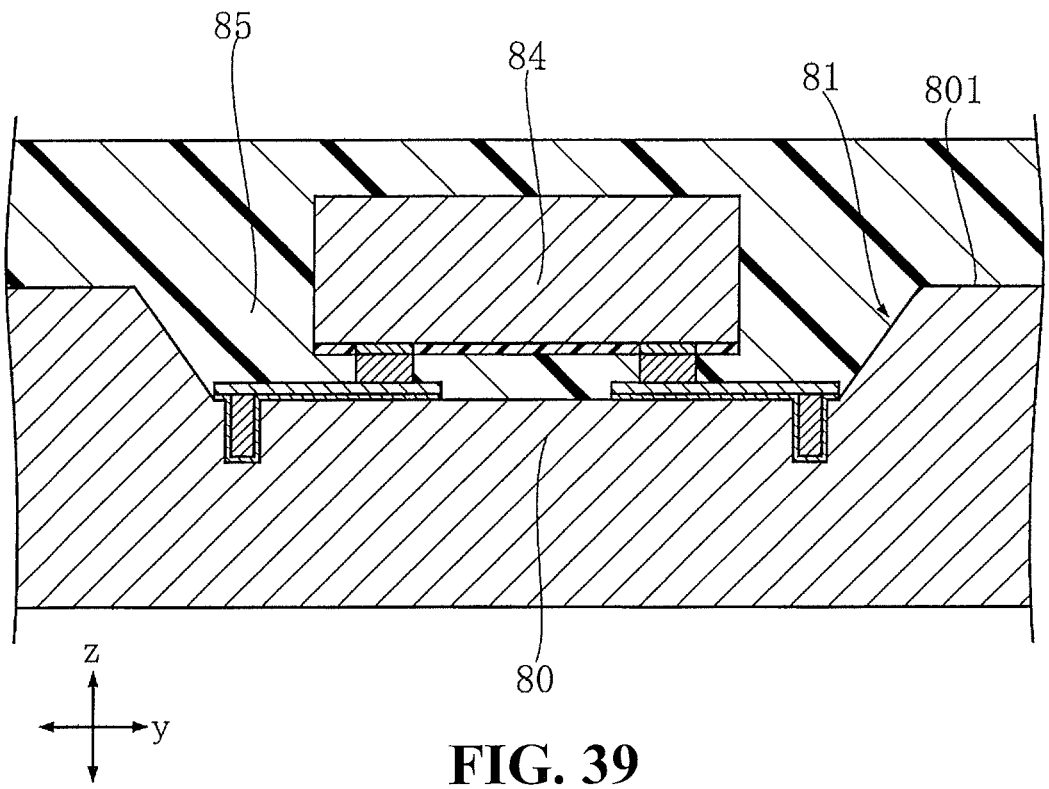
FIG. 39 is a cross-sectional view showing a method for forming the semiconductor device shown in FIG. 24.

Then, as shown in FIG. 39, a sealing resin 85 is formed. The sealing resin 85 is corresponding to the sealing resin 30 of the semiconductor device A30. The sealing resin 85 of the present embodiment includes a black epoxy resin, for example. The sealing resin 85 is formed by compression molding. The sealing resin 85 is formed to fill the recess 81 and cover the main surface 801 of the base material 80 and the semiconductor element 84.

Figure 40:
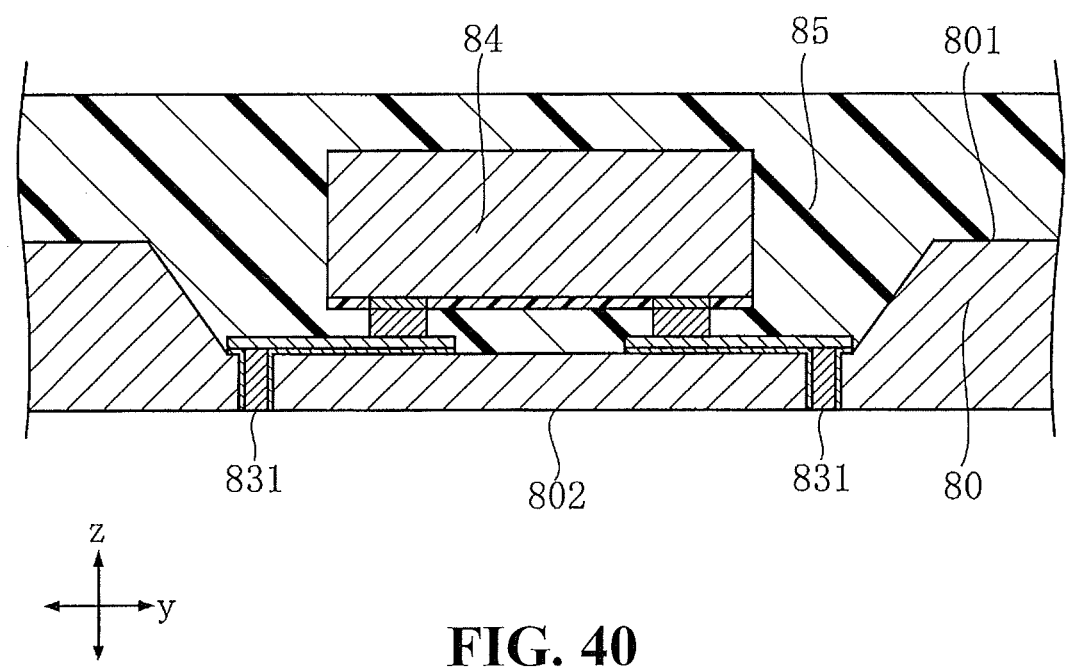
FIG. 40 is a cross-sectional view showing a method for forming the semiconductor device shown in FIG. 24.

Then, as shown in FIG. 40, the portion of the base material 80 at the side opposite to the main surface 801 in the thickness direction z is removed, so as to expose the intermediate conductive layer 831 from the base material 80. The removal is performed by mechanical grinding. At this time, the base material 80 is exposed on the back surface 802 at the side opposite to the main surface 801 in the thickness direction z. At this time, the base material 80 is corresponding to the substrate 101 of the semiconductor device A30.

Figure 41:
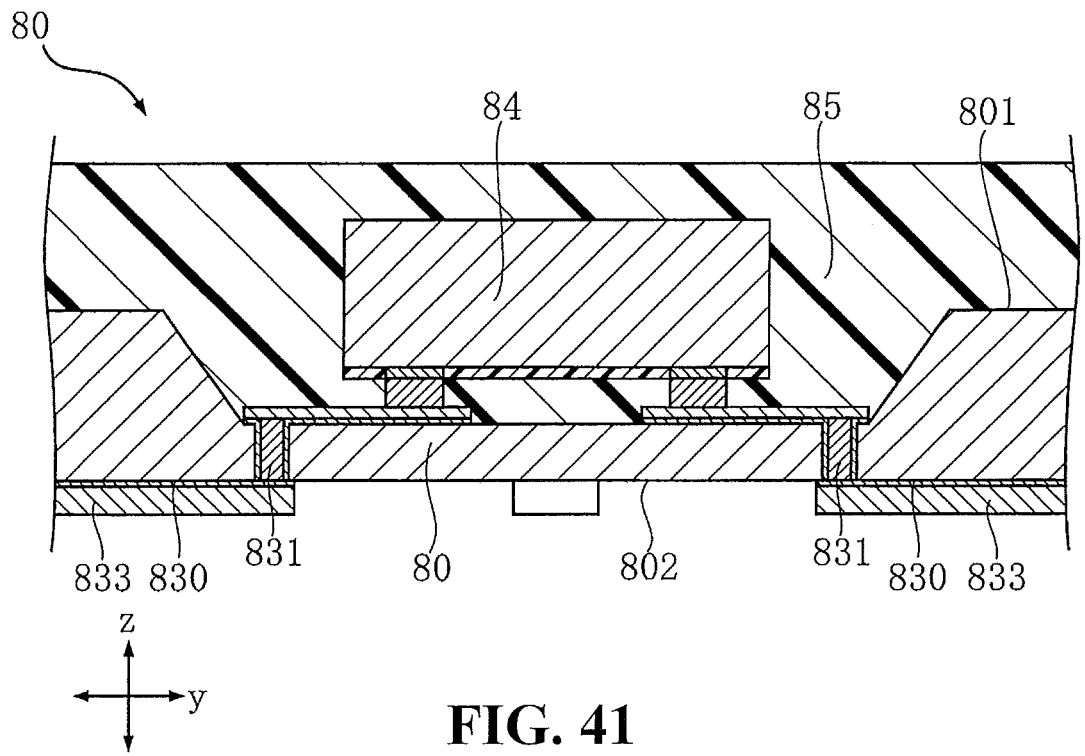
FIG. 41 is a cross-sectional view showing a method for forming the semiconductor device shown in FIG. 24.

Then, as shown in FIG. 41, after the base layer 830 is formed to be connected to both the back surface 802 of the base material 80 and the intermediate conductive layer 831, an external conductive layer 833 is formed to be connected to the base layer 830. The configuration and the method for forming the base layer 830 in this step are the same as the base layer 830 in the steps shown in FIG. 31. The external conductive layer 833 is formed by the following manner, i.e. after the mask is formed by photolithography, Cu is deposited by electrolytic plating using the base layer 830 as a conductive path. After the external conductive layer 833 is formed, the base layer 830 which is not covered by the external conductive layer 833 is removed. The method for removing the base layer 830 is the same as the method for removing the base layer 830 in the step shown in FIG. 37.

Figure 42:
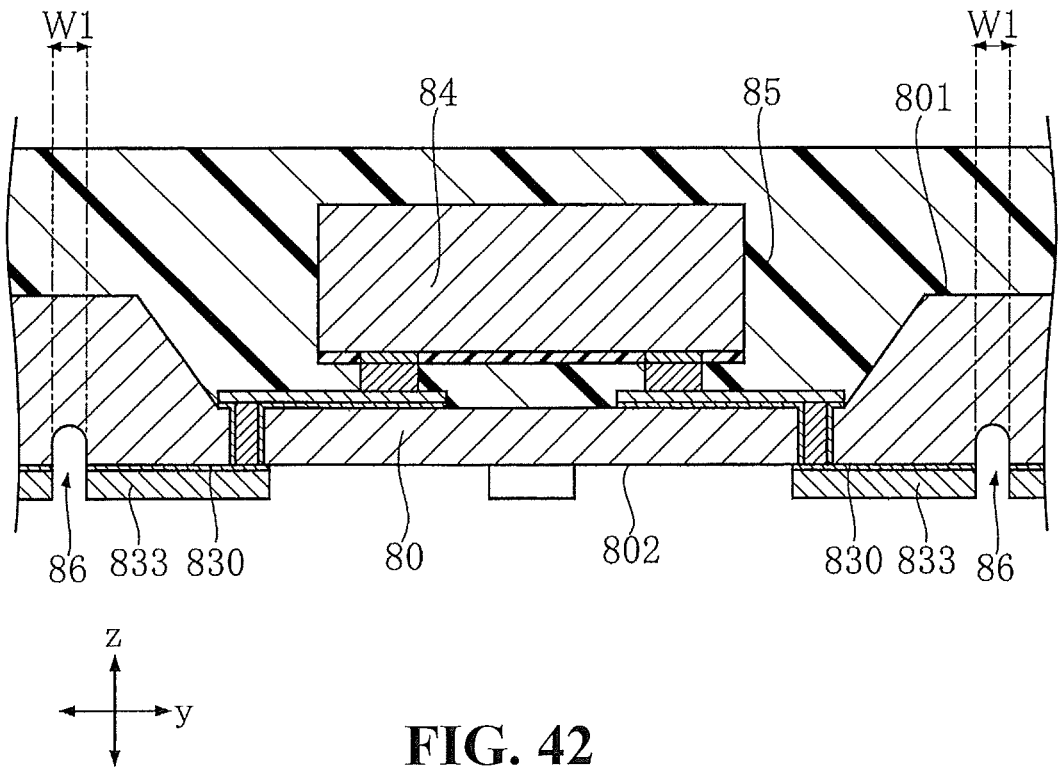
FIG. 42 is a cross-sectional view showing a method for forming the semiconductor device shown in FIG. 24.

Then, as shown in FIG. 42, a groove 86 is formed on the base material 80, the base layer 830 and the external conductive layer 833 and recessed from the back surface 802 of the base material 80 toward the thickness direction z. The groove 86 is formed along both the first direction x and the second direction y. The groove 86 is formed by plasma cutting, for example. With the formation of the groove 86, a portion of the base material 80 is removed, and the external conductive layer 833 is cut using the groove 86 as a boundary. In the present embodiment, the groove 86 is formed with a width W1 (the length in the first direction x or the second direction y) shown in FIG. 42 in the manner that a front end of the groove 86 does not reach the main surface 801 of the base material 80. At this time, the external conductive layer 833 is corresponding to the second conductive layer 102B (the conductive layer 102) of the semiconductor device A30.

Figure 43:
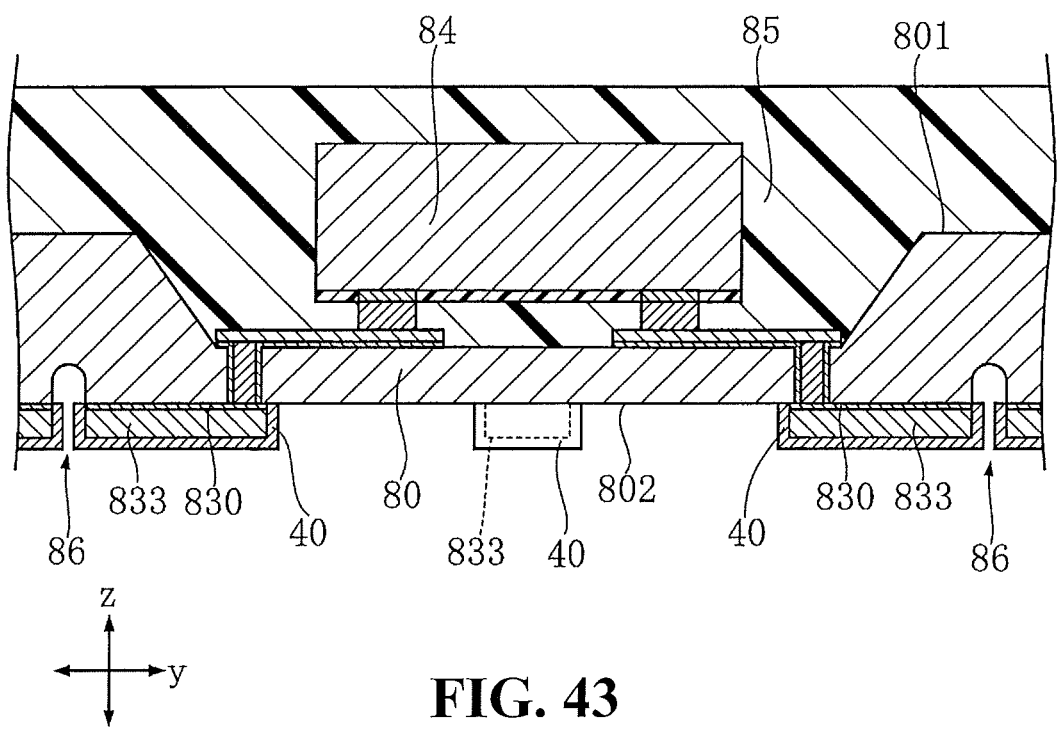
FIG. 43 is a cross-sectional view showing a method for forming the semiconductor device shown in FIG. 24.

Then, as shown in FIG. 43, an external terminal 40 is formed to be connected to the external conductive layer 833. The external terminal 40 is formed by depositing a plurality of metal layers using electroless plating. Further, the configuration of the metal layer is the same as the external terminal 40 of the semiconductor device A10. At this time, the external conductive layer 833 is covered by the external terminal 40.

Figure 44:
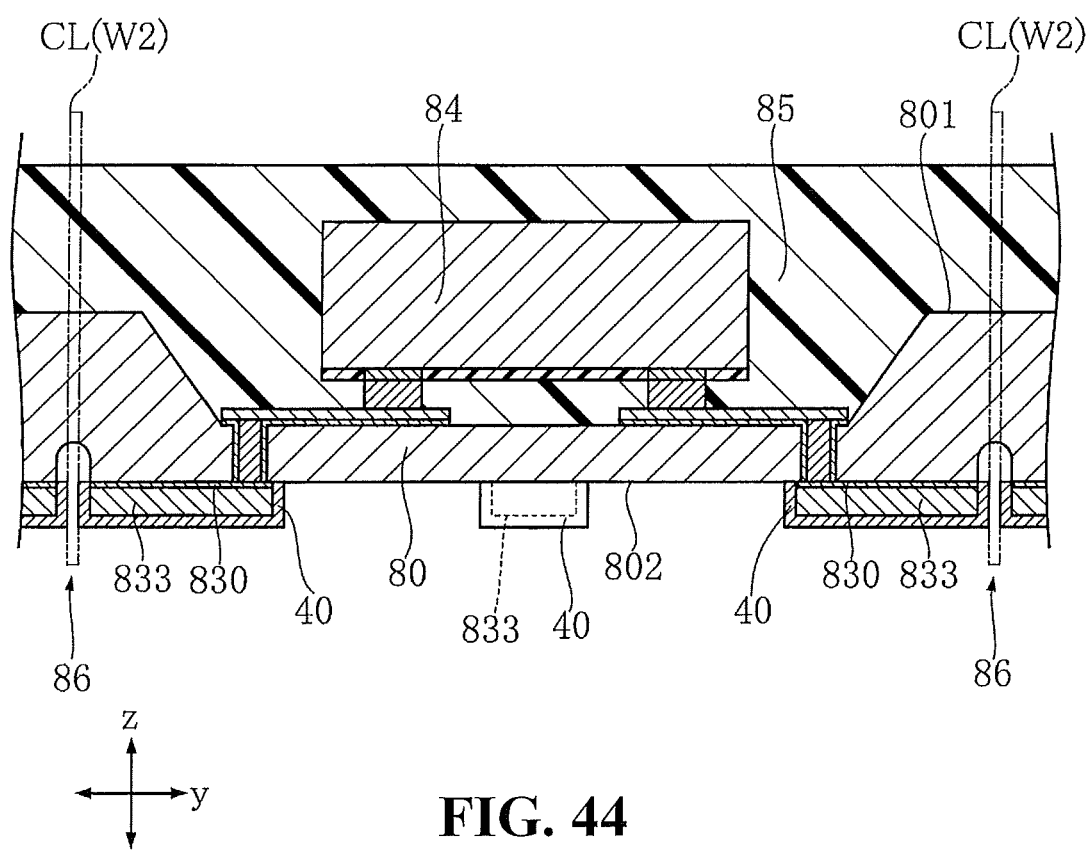
FIG. 44 is a cross-sectional view showing a method for forming the semiconductor device shown in FIG. 24.

Then, as shown in FIG. 44, the base material 80 and the sealing resin 85 are cut along both the first direction x and the second direction y though the groove 86, and cut into individual pieces containing the semiconductor element 84. The base material 80 and the sealing resin 85 are cut by plasma cutting, for example. For example, when the base material 80 and the sealing resin 85 are cut along the first direction x, the region surrounding by the cutting line CL shown in FIG. 44 is removed. In this case, the width W2 (the length in the second direction y) of the cutting line CL is set to be shorter than the width W1 of the groove 86. In this step, the singulated individual piece including the semiconductor element 84 becomes the semiconductor device A30. By performing the above step, the semiconductor device A30 is fabricated. Further, in the step of forming the groove 86 shown in FIG. 42, if the width W1 is set larger, the semiconductor device A31 shown in FIG. 31 can be obtained.

Then, the effects of the semiconductor device A30 are illustrated.

The semiconductor device A30 includes the same external terminal 40 having the Ni layer and the Au layer formed by electroless plating as the semiconductor device A10. Further, the external terminal 40 is connected to and laminated with the whole of each of the end surface 13 and the mounting surface 12 of the second conductive layer 102B (the conductive layer 102) constituting the conductive support 10. Hence, according to the semiconductor device A30, miniaturization can be achieved, and reduction of mountability to a wiring substrate may be prevented.

The substrate 101 for forming the conductive support 10 of the semiconductor device A30 is made of an intrinsic semiconductor material. If Si is used as the intrinsic semiconductor material, the thermal conductivity of the substrate is improved. Hence, when the semiconductor device A30 is used, heat generated from the semiconductor element 20 is dissipated to outside more efficiently.

Further, a recess 15 is formed in the substrate 101 and recessed from the main surface 101A toward the thickness direction z, and the semiconductor element 20 is accommodated in the recess 15. The recess 15 is formed by microprocessing such as crystal anisotropic etching. Hence, in terms of stably supporting the semiconductor element 20 for miniaturization, the conductive support 10 of the semiconductor device A30 is a proper configuration.

Fourth Embodiment

Figure 45:
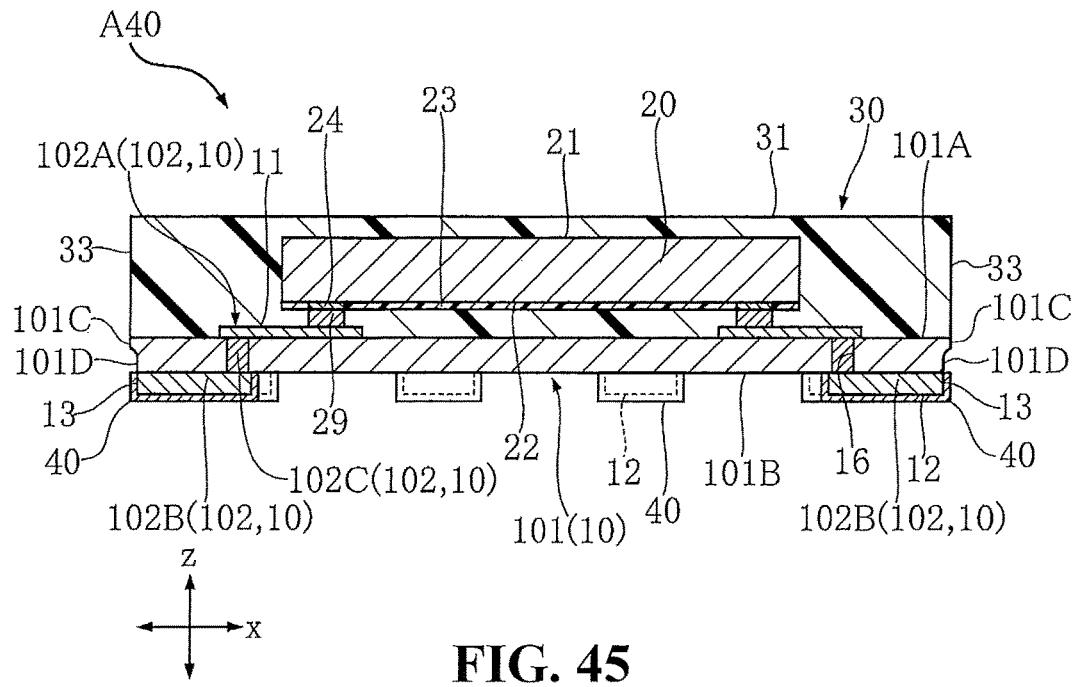
FIG. 45 is a cross-sectional view showing a semiconductor device according to the fourth embodiment of the present invention.
Figure 46:
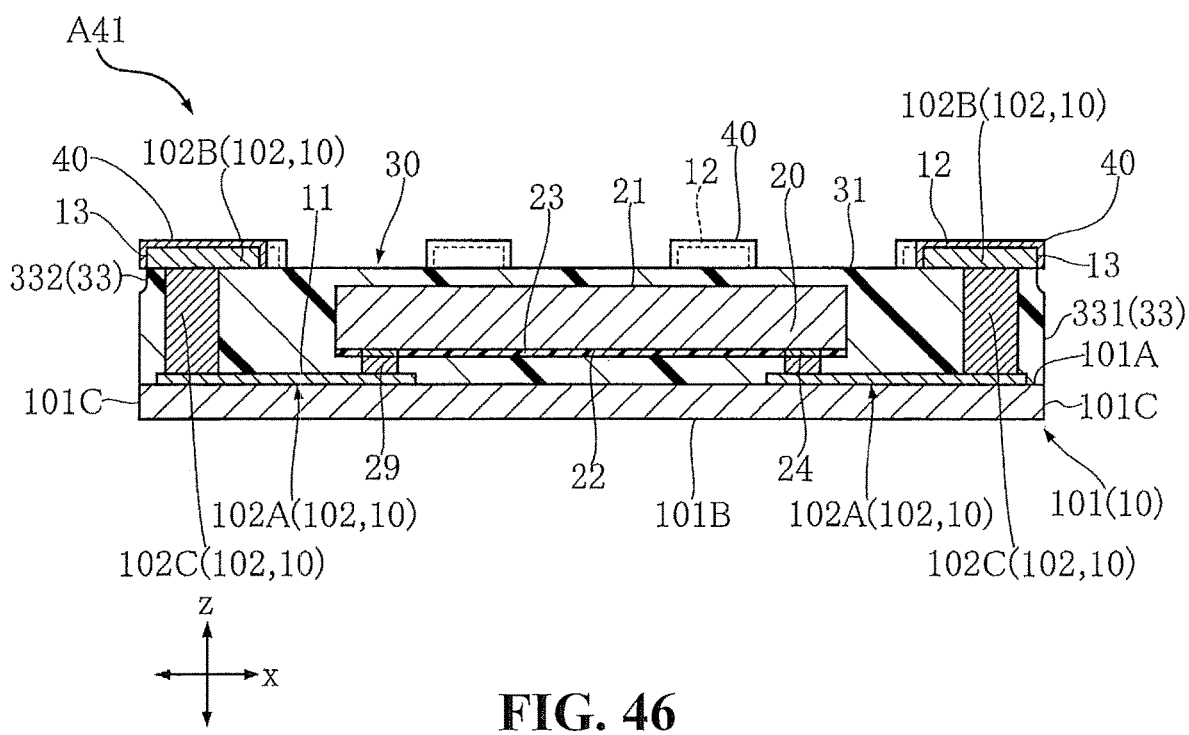
FIG. 46 is a cross-sectional view showing a variation of the semiconductor device shown in FIG. 45.

Based on FIG. 45 and FIG. 46, a semiconductor device A40 of the fourth embodiment of the present invention is illustrated. In these figures, elements the same as or similar to those of the above-described semiconductor device A30 are denoted by the same reference numerals, and duplicated explanations are omitted. FIG. 45 and FIG. 46 show the same position of the cross-section as the position of the cross-section shown in FIG. 28.

The semiconductor device A40 has the configuration of a conductive support (a substrate 101 and a conductive layer 102) and a sealing resin 30, and is different from the configuration of the semiconductor device A30. As shown in FIG. 45, in the present embodiment, no recess 15 is formed in the substrate 101. Further, a first conductive layer 102A (conductive layer 102) is disposed on a main surface 101A of the substrate 101. The sealing resin 30 is configured to cover a semiconductor element 20, and the sealing resin 30 is disposed on the main surface 101A. Further, in the present embodiment, a conductive support 10 and an external terminal 40 have the same configuration as that of the semiconductor device A31 shown in FIG. 31.

As a variation (a semiconductor device A41) of the semiconductor device A40, the configuration of the conductive support 10 (the substrate 101 and the conductive layer 102) and the sealing resin 30 shown in FIG. 46 can be used.

In this variation, the substrate 101 has no inner surface 101D, and no through hole 16 is formed in the substrate 101. A second conductive layer 102B is disposed on a resin main surface 31 of the sealing resin 30. An intermediate conductive layer 102C is extended from the first conductive layer 102A toward the second conductive layer 102B, and exposed from the resin main surface 31. Hence, the intermediate conductive layer 102C is covered by the sealing resin 30 except the region exposed from the resin main surface 31. A resin lateral surface 33 of the sealing resin 30 includes a resin outer surface 331 and a resin inner surface 332. Further, in this variation, the mounting surface 12 of the conductive layer 102 faces toward the same direction as the support surface 11.

The semiconductor device A40 includes the same external terminal 40 having the Ni layer and the Au layer formed by electroless plating as the semiconductor device A10. Further, the external terminal 40 is connected to and laminated with the whole of each of the end surface 13 and the mounting surface 12 of the second conductive layer 102B (the conductive layer 102) constituting the conductive support 10. Hence, according to the semiconductor device A40, miniaturization can be achieved, and reduction of mountability to a wiring substrate may be prevented.

The present invention is not limited to the above embodiments. The specific configuration of each portion of the present invention can be freely changed to various designs.

What is claimed is:

1. A semiconductor device, comprising:
   a conductive support having a support surface and a mounting surface facing opposite sides in a thickness direction, and an end surface intersecting with the mounting surface of the conductive support and facing outside;
   a semiconductor element having an element back surface facing the support surface of the conductive support and an electrode formed on the element back surface of the semiconductor element, in which the electrode is connected to the support surface of the conductive support;
   an external terminal electrically connected to the mounting surface of the conductive support and exposed to the outside;
   wherein the external terminal comprises a Ni layer having P and an Au layer, and respectively connected to and laminated with at least one portion of each of the mounting surface of the conductive support and the end surface of the conductive support;
   a sealing resin, in which the sealing resin has a resin back surface facing toward a same direction as the mounting surface of the conductive support and a resin lateral surface intersecting with the resin back surface of the sealing resin, and covers at least a portion of the conductive support and the semiconductor element; and
      an insulating film connected to a portion of the mounting surface of the conductive support and the resin back surface of the sealing resin, wherein the external terminal is exposed from the insulating film to the outside.

2. The semiconductor device of claim 1, wherein the external terminal is across and laminated on a boundary between the mounting surface of the conductive support and the end surface of the conductive support.

3. The semiconductor device of claim 1, wherein the external terminal comprises the Ni layer connected to the mounting surface of the conductive support and the end surface of the conductive support, and the Au layer connected to the Ni layer.

4. The semiconductor device of claim 1, wherein the external terminal comprises the Ni layer connected to the mounting surface of the conductive support and the end surface of the conductive support, a Pd layer connected to the Ni layer, and the Au layer connected to the Pd layer.

5. The semiconductor device of claim 1, wherein the conductive support comprises a metal; and
the external terminal is exposed from the resin back surface of the sealing resin and the resin lateral surface of the sealing resin to the outside.

6. The semiconductor device of claim 5, wherein the conductive support comprises Ni.

7. The semiconductor device of claim 5, wherein the conductive support comprises a lead frame including Cu.

8. The semiconductor device of claim 7, wherein the conductive support is formed with a concave portion recessed from the mounting surface of the conductive support toward the thickness direction; and
the sealing resin is connected to the concave portion of the conductive support.

9. The semiconductor device of claim 8, further comprising an insulating film configured to be connected to the resin back surface of the sealing resin,
wherein the external terminal exposed from the insulating film to the outside.

10. The semiconductor device of claim 1, wherein the end surface of the conductive support comprises:
an outer end surface intersecting with the support surface of the conductive support; and an inner end surface recessed from the outer end surface of the conductive support toward an inner portion of the conductive support and intersecting with the outer end surface of the conductive support and the mounting surface of the conductive support; and
the external terminal is connected to and laminated with the inner end surface of the conductive support.

11. The semiconductor device of claim 5, wherein the sealing resin further comprises:
a resin main surface facing toward an opposite side of the resin back surface of the sealing resin;
the resin lateral surface of the sealing resin comprises: a resin outer surface intersecting with the resin main surface of the sealing resin; and a resin inner surface recessed from the resin outer surface of the sealing resin toward an inner portion of the sealing resin and intersecting with the resin outer surface of the sealing resin and the resin back surface of the sealing resin;
the end surface of the conductive support is coplanar with the resin inner surface of the sealing resin; and the external terminal is connected to and laminated with the whole of the end surface of the conductive support.

12. The semiconductor device of claim 1, wherein the conductive support comprises: a substrate comprising an intrinsic semiconductor material, and having a main surface facing toward a same direction as the support surface of the conductive support and a back surface facing toward a same direction as the mounting surface of the conductive support; and a conductive structure having the support surface of the conductive support, the mounting surface of the conductive support and the end surface of the conductive support, and disposed on the substrate of the conductive support;
a recess is formed on the substrate of the conductive support, recessed from the main surface of the substrate of the conductive support toward the thickness direction and accommodating the semiconductor element; and
the conductive structure of the conductive support comprises: a first conductive layer having the support surface of the conductive support and disposed on a bottom surface of the recess of the substrate of the conductive support; a second conductive layer having the mounting surface of the conductive support and the end surface of the conductive support and disposed on the back surface of the substrate of the conductive support; and an intermediate conductive layer for electrically connecting the first conductive layer of the conductive structure of the conductive support and the second conductive layer of the conductive structure of the conductive support with each other.

13. The semiconductor device of claim 12, wherein on the substrate of the conductive support, a through hole is formed from the bottom surface of the recess of the substrate of the conductive support to the back surface of the substrate of the conductive support; and
the intermediate conductive layer of the conductive structure of the conductive support is disposed inside the through hole.

14. The semiconductor device of claim 13, wherein the substrate further comprises: an outer surface intersecting with the main surface of the substrate of the conductive support; and an inner surface recessed from the outer surface of the substrate of the conductive support toward an inner portion of the substrate of the conductive support and intersecting with the outer surface of the substrate of the conductive support and the back surface of the substrate of the conductive support;
the end surface of the conductive support is coplanar with the inner surface of the substrate of the conductive support; and
the external terminal is connected to and laminated with the whole of the end surface of the conductive support.

15. The semiconductor device of claim 12, further comprising a sealing resin filled in the recess of the substrate of the conductive support and covering the semiconductor element.

16. The semiconductor device of claim 1, further comprising a bonding layer interposed between the support surface of the conductive support and the electrode,
wherein the bonding layer comprises an alloy having Sn.

17. A semiconductor device, comprising:
a conductive support having a support surface and a mounting surface facing opposite sides in a thickness direction, and an end surface intersecting with the mounting surface of the conductive support and facing outside;
a semiconductor element having an element back surface facing the support surface of the conductive support and an electrode formed on the element back surface of the semiconductor element, in which the electrode is connected to the support surface of the conductive support;
an external terminal electrically connected to the mounting surface of the conductive support and exposed to the outside; wherein the external terminal comprises a Ni layer having P and an Au layer, and respectively connected to and laminated with at least one portion of each of the mounting surface of the conductive support and the end surface of the conductive support; and
a sealing resin, in which the sealing resin has a resin back surface facing toward a same direction as the mounting surface of the conductive support and a resin lateral surface intersecting with the resin back surface of the sealing resin, and covers at least a portion of the conductive support and the semiconductor element, wherein the resin back surface of the sealing resin is coplanar with the mounting surface of the conductive support.

18. The semiconductor device of claim 17, wherein the external terminal is across and laminated on a boundary between the mounting surface of the conductive support and the end surface of the conductive support.

19. The semiconductor device of claim 17, wherein the external terminal comprises the Ni layer connected to the mounting surface of the conductive support and the end surface of the conductive support, and the Au layer connected to the Ni layer.

20. The semiconductor device of claim 17, wherein the external terminal comprises the Ni layer connected to the mounting surface of the conductive support and the end surface of the conductive support, a Pd layer connected to the Ni layer, and the Au layer connected to the Pd layer.

21. The semiconductor device of claim 17, wherein the conductive support comprises a metal; and
the external terminal is exposed from an insulating film formed on the resin back surface of the sealing resin and the resin lateral surface of the sealing resin to the outside.

22. The semiconductor device of claim 21, wherein the conductive support comprises Ni.

23. The semiconductor device of claim 17, further comprising an insulating film connected to a portion of the mounting surface of the conductive support and the resin back surface of the sealing resin,
wherein the external terminal is exposed from the insulating film to the outside.

24. The semiconductor device of claim 21, wherein the conductive support comprises a lead frame including Cu.

25. The semiconductor device of claim 24, wherein the conductive support is formed with a concave portion recessed from the mounting surface of the conductive support toward the thickness direction; and
the sealing resin is connected to the concave portion of the conductive support.

26. The semiconductor device of claim 17, further comprising an insulating film configured to be connected to the resin back surface of the sealing resin,
wherein the external terminal exposed from the insulating film to the outside.

27. The semiconductor device of claim 17, wherein the end surface of the conductive support comprises: an outer end surface intersecting with the support surface of the conductive support; and an inner end surface recessed from the outer end surface of the conductive support toward an inner portion of the conductive support and intersecting with the outer end surface of the conductive support and the mounting surface of the conductive support; and
the external terminal is connected to and laminated with the inner end surface of the conductive support.

28. The semiconductor device of claim 17, wherein the sealing resin further comprises a resin main surface facing toward an opposite side of the resin back surface of the sealing resin;
the resin lateral surface of the sealing resin comprises: a resin outer surface intersecting with the resin main surface of the sealing resin; and a resin inner surface recessed from the resin outer surface of the sealing resin toward an inner portion of the sealing resin and intersecting with the resin outer surface of the sealing resin and the resin back surface of the sealing resin; the end surface of the conductive support is coplanar with the resin inner surface of the sealing resin; and
the external terminal is connected to and laminated with the whole of the end surface of the conductive support.

29. The semiconductor device of claim 17, wherein the conductive support comprises: a substrate comprising an intrinsic semiconductor material, and having a main surface facing toward a same direction as the support surface of the conductive support and a back surface facing toward a same direction as the mounting surface of the conductive support; and a conductive structure having the support surface of the conductive support, the mounting surface of the conductive support and the end surface of the conductive support, and disposed on the substrate of the conductive support;
a recess is formed on the substrate of the conductive support, recessed from the main surface of the substrate of the conductive support toward the thickness direction and accommodating the semiconductor element; and
the conductive structure of the conductive support comprises: a first conductive layer having the support surface of the conductive support and disposed on a bottom surface of the recess of the substrate of the conductive support; a second conductive layer having the mounting surface of the conductive support and the end surface of the conductive support and disposed on the back surface of the substrate of the conductive support; and an intermediate conductive layer for electrically connecting the first conductive layer of the conductive structure of the conductive support and the second conductive layer of the conductive structure of the conductive support with each other.

30. The semiconductor device of claim 29, wherein on the substrate of the conductive support, a through hole is formed from the bottom surface of the recess of the substrate of the conductive support to the back surface of the substrate of the conductive support; and
the intermediate conductive layer of the conductive structure of the conductive support is disposed inside the through hole.

31. The semiconductor device of claim 30, wherein the substrate of the conductive support further comprises: an outer surface intersecting with the main surface of the substrate of the conductive support; and an inner surface recessed from the outer surface of the substrate of the conductive support toward an inner portion of the substrate of the conductive support and intersecting with the outer surface of the substrate of the conductive support and the back surface of the substrate of the conductive support;
the end surface of the conductive support is coplanar with the inner surface of the substrate of the conductive support; and
the external terminal is connected to and laminated with the whole of the end surface of the conductive support.

32. The semiconductor device of claim 29, further comprising a sealing resin filled in the recess of the substrate of the conductive support and covering the semiconductor element.

33. The semiconductor device of claim 17, further comprising a bonding layer interposed between the support surface of the conductive support and the electrode, wherein the bonding layer comprises an alloy having Sn.

* * * * *